US007889019B2

(12) United States Patent
Gizara

(10) Patent No.: US 7,889,019 B2
(45) Date of Patent: Feb. 15, 2011

(54) PULSE WIDTH MODULATION SEQUENCE GENERATING A NEAR CRITICAL DAMPED STEP RESPONSE

(76) Inventor: Andrew Roman Gizara, 24471 Corta Cresta Dr., Lake Forest, CA (US) 92630-3914

( * ) Notice: Subject to any disclaimer, the term of this patent is extended or adjusted under 35 U.S.C. 154(b) by 1117 days.

(21) Appl. No.: 11/549,586

(22) Filed: Oct. 13, 2006

(65) Prior Publication Data

US 2008/0088385 A1 Apr. 17, 2008

(51) Int. Cl.
 *H02M 1/14* (2006.01)
 *H03K 3/00* (2006.01)
 *H03K 7/00* (2006.01)
(52) U.S. Cl. .................. 332/109; 327/172; 327/530; 327/544; 363/41
(58) Field of Classification Search ......... 332/109–111; 327/172, 176, 177, 530, 538, 544; 363/41
See application file for complete search history.

(56) References Cited

U.S. PATENT DOCUMENTS

| 4,084,103 | A | | 4/1978 | Burns, III et al. | |
|---|---|---|---|---|---|
| 4,118,696 | A | | 10/1978 | Warther | |
| 4,258,622 | A | * | 3/1981 | Estrabaud et al. | 101/93.01 |
| 4,916,635 | A | | 4/1990 | Singer et al. | |
| 5,132,606 | A | | 7/1992 | Herbert | |
| 5,570,276 | A | | 10/1996 | Cuk et al. | |
| 5,932,938 | A | | 8/1999 | Shimamori | |
| 6,057,675 | A | | 5/2000 | Tateishi | |
| 6,229,292 | B1 | | 5/2001 | Redl et al. | |

(Continued)

FOREIGN PATENT DOCUMENTS

EP 0 093 902 A1 11/1983

(Continued)

OTHER PUBLICATIONS

U.S. Appl. No. 12/781,724; (Gizara, Andrew Roman); filed May 17, 2010.*

(Continued)

*Primary Examiner*—David Mis
(74) *Attorney, Agent, or Firm*—Sterne, Kessler, Goldstein & Fox P.L.L.C.

(57) ABSTRACT

A digital circuit implementing pulse width modulation controls power delivered in what one can model as a second order or higher order system. An exemplary control plant could embody a step-down switch mode power supply providing a precise sequence of voltages or currents to any of a variety of loads such as the core voltage of a semiconductor unique compared to its input/output ring voltage. An algorithm produces a specific sequence of pulses of varying width such that the voltage or current delivered to the load from the system plant closely resembles a critical damped step response. The specific pulse width modulation sequence controls a plant that provides a near critical damped step response in one embodiment without a feed-forward or feedback loop physically embodied in the control system thereby reducing the parts cost or control semiconductor production yield cost while enhancing noise immunity and long term reliability of the control system. The specific algorithm exhibits tolerance to variations of twenty percent or greater in output load or ten percent or greater in control plant element parameters thus maintaining near critical damped step response characteristics when actual parameter values deviate from initial estimates.

24 Claims, 11 Drawing Sheets

U.S. PATENT DOCUMENTS

| | | | |
|---|---|---|---|
| 6,292,122 | B1 | 9/2001 | Younis et al. |
| 6,396,725 | B1 | 5/2002 | Jacobs et al. |
| 6,683,767 | B2 | 1/2004 | Ito et al. |
| 6,781,353 | B2 | 8/2004 | Rozsypal |
| 6,940,189 | B2 | 9/2005 | Gizara |
| 6,965,221 | B2 | 11/2005 | Lipcsei et al. |
| 7,007,176 | B2 | 2/2006 | Goodfellow et al. |
| 7,057,907 | B2 | 6/2006 | Oh |
| 7,098,640 | B2 | 8/2006 | Brown |
| 7,106,039 | B1 | 9/2006 | Scott et al. |
| 7,107,468 | B2 | 9/2006 | Pullen et al. |
| 7,152,083 | B2 | 12/2006 | Singh |
| 7,248,027 | B2 | 7/2007 | Ribeiro et al. |
| 2005/0184716 | A1 | 8/2005 | Brown |
| 2008/0100362 | A1 | 5/2008 | Gizara |

FOREIGN PATENT DOCUMENTS

| | | |
|---|---|---|
| EP | 1 783 568 | 5/2007 |
| WO | WO 95/34121 | 12/1995 |
| WO | WO 2006/013776 | 2/2006 |
| WO | WO 2008/048865 A3 | 4/2008 |
| WO | WO 2008/060850 A2 | 5/2008 |

OTHER PUBLICATIONS

Gizara, U.S. Appl. No. 11/369,161, filed Mar. 6, 2006, entitled "System and Method for Integrating a Digital Core With a Switch Mode Power Supply."

International Search Report for Appl. No. PCT/US07/81148, issued Apr. 22, 2008, 5 pages.

Yanagawa et al., "PID Auto-tuning Controller Using a Single Neuron for DC Servomotor," Industrial Electronics, 1992, Proceedings of the IEEE International Sumposium on Xian, China, May 25-29, 1992, pp. 277-280.

Luo et al., "Mathematical Modeling of Power DC/DC Converters," Power System Technology, 2004. Powercon 2004. 2004 International Conferenc e on Singapore, Nov. 21-24, 2004, Piscataway, NJ, USA, IEEE, US, Nov. 21, 2004, pp. 17-22 vol. 1.

International Search Report for Appl. No. PCT/US07/82956, issued May 8, 2008, 3 pages.

International Search Report for Appl. No. PCT/US07/82956, issued May 8, 2008, 3 pages.

Extended European Search Report with European Search Opinion for European Patent Application No. EP 10 17 3926.6, European Patent Office, Munich, Germany, mailed on Oct. 19, 2010.

* cited by examiner

301 — $$\frac{v_o(t)}{V_{in}A_{OF}} = 1 - (1+\omega_0 t)e^{-\omega_0 t}$$

302 — $$D(n) = (u(t) - u(t-n_1 T_{sw})) + u(t-n_1 T_{sw})(1 - (1+\omega_0(n+n_2)T_{sw})e^{-\omega_0(n+n_2)T_{sw}}))A_{V0}$$

303 — $$A_{V0} \equiv \frac{V_{out}}{V_{in}}$$

304 — $$y_m(t) \equiv h(t) * x_m(t)$$

305 — $$x_m(t) = V_{in}\sum_{n=0}^{N}(u(t-t_0) - u(t-t_0-n_1 T_{sw}))[u(t-t_0-nT_{sw}) - u(t-t_0-nT_{sw}-A_{V0}T_{sw})] +$$
$$u(t-t_0-n_1 T_{sw})[u(t-t_0-nT_{sw}) - u(t-t_0-nT_{sw}-A_{V0}T_{sw}(1-(1+\omega_0(n+n_2)T_{sw})e^{-\omega_0(n+n_2)T_{sw}}))]$$

FIG. 3

```
500
501  L1 core sw 4.7μ Ipk=1.4 Rser=.037 Rpar=1000000 Cpar=15p
502  C1 core 0 10μ V=6.3 Irms=2 Rser=.006 Lser=.000000001 Rpar=1000000 Cpar=.000000001
503  Vin in 0 3.30
504  XU1 sw gdrvr 0 sw gdrvr in Si5513DC
505  * for Vcore0 n1= 7, for Vcore1 n1= 3 sample periods at PW =Av0*Ade,Av1*Ade,
506  * PW(n) scaled to critical damped response time domain function (n)*Av0*Ade,Av1*Ade
507  * invert D[n] for Top PFET
508  Vgdrvr gdrvr 0 PWL(0.0000099950 3.3 0.0000100000 0.0 0.0000105890 0.0 0.0000105940 3.3
509           +      0.0000109950 3.3 0.0000110000 0.0 0.0000115890 0.0 0.0000115940 3.3
510           +      0.0000119950 3.3 0.0000120000 0.0 0.0000125890 0.0 0.0000125940 3.3
511           +      0.0000129950 3.3 0.0000130000 0.0 0.0000135890 0.0 0.0000135940 3.3
512           +      0.0000139950 3.3 0.0000140000 0.0 0.0000145890 0.0 0.0000145940 3.3
513           +      0.0000149950 3.3 0.0000150000 0.0 0.0000155890 0.0 0.0000155940 3.3
514           +      0.0000159950 3.3 0.0000160000 0.0 0.0000165890 0.0 0.0000165940 3.3
515           +      0.0000169950 3.3 0.0000170000 0.0 0.0000171917 0.0 0.0000171967 3.3
                                        516
517           +      0.0001999950 3.3 0.0002000000 0.0 0.0002004908 0.0 0.0002004958 3.3
518           +      0.0002009950 3.3 0.0002010000 0.0 0.0002014908 0.0 0.0002014958 3.3)
519  ILoad core 0 TBL(0.45 0  0.55 3.0556E-01  3.3 1.83         )
520  *R1 core 0      1.8
521  .inc si5513DC_ps.lib
522  .tran .0002 startup
523  .end
```

$$D_+(n) = (u(t) - u(t-n_1T_{sw})) + u(t-n_1T_{sw})(1-(1+\omega_0(n+n_2)T_{sw})e^{-\omega_0(n+n_2)T_{sw}}))A_{V0}A_{DE}$$

602

$$A_{DE} \equiv \left.\frac{V_{out}}{V_{in}}\right|_{t\to\infty}$$

603

$$A_{DE} \propto V_{out}(V_{in}), I_{out}, F_{sw}$$

604

$$V_{sw} = V_{in}/A_{DE}$$

605

$$x_m(t) = V_{sw}\sum_{n=0}^{N}(u(t-t_0)-u(t-t_0-n_1T_{sw}))[u(t-t_0-nT_{sw})-u(t-t_0-nT_{sw}-A_{V0}A_{DE}T_{sw})] +$$
$$u(t-t_0-n_1T_{sw})[u(t-t_0-nT_{sw})-u(t-t_0-nT_{sw}-A_{V0}A_{DE}T_{sw}(1-(1+\omega_0(n+n_2)T_{sw})e^{-\omega_0(n+n_2)T_{sw}}))]$$

606

$$D_-(n) = (u(t)-u(t-n_1T_{sw}))A_{V1}A_{DE} +$$
$$u(t-n_1T_{sw})(A_{V0}-(A_{V0}-A_{V1})(1-(1+\omega_0(n+n_2)T_{sw})e^{-\omega_0(n+n_2)T_{sw}}))A_{DE}\Big|_{A_{V0}>A_{V1}}$$

607

$$D_+(n) = (u(t)-u(t-n_1T_{sw}))A_{V1}A_{DE} +$$
$$u(t-n_1T_{sw})(A_{V0}+(A_{V1}-A_{V0})(1-(1+\omega_0(n+n_2)T_{sw})e^{-\omega_0(n+n_2)T_{sw}}))A_{DE}\Big|_{A_{V1}>A_{V0}}$$

608

$$x_m(t)\Big|_{T_{Set0}>T_{Set1}} = V_{sw}\sum_{n=0}^{N}(u(t-t_0)-u(t-t_0-n_1T_{sw}))[u(t-t_0-nT_{sw})-u(t-t_0-nT_{sw}-T_{Set1})] +$$
$$u(t-t_0-n_1T_{sw})[u(t-t_0-nT_{sw})-u(t-t_0-nT_{sw}-(T_{Set0}-(T_{Set0}-T_{Set1})(1-(1+\omega_0(n+n_2)T_{sw})e^{-\omega_0(n+n_2)T_{sw}})))]$$

609

$$x_m(t)\Big|_{T_{Set1}>T_{Set0}} = V_{sw}\sum_{n=0}^{N}(u(t-t_0)-u(t-t_0-n_1T_{sw}))[u(t-t_0-nT_{sw})-u(t-t_0-nT_{sw}-T_{Set1})] +$$
$$u(t-t_0-n_1T_{sw})[u(t-t_0-nT_{sw})-u(t-t_0-nT_{sw}-(T_{Set0}+(T_{Set1}-T_{Set0})(1-(1+\omega_0(n+n_2)T_{sw})e^{-\omega_0(n+n_2)T_{sw}})))]$$

610

$$T_{Set(p)} \equiv A_{V(p)}A_{DE(p)}T_{sw}$$

611

$$\Delta T_{Set(p)} \equiv T_{Set(p+1)} - T_{Set(p)}$$

612

$$n_1, n_2 \propto |\Delta T_{Set(p)}|$$

FIG. 6

PULSE WIDTH MODULATION SEQUENCE GENERATING A NEAR CRITICAL DAMPED STEP RESPONSE

BACKGROUND OF THE INVENTION

1. Field of the Invention

The present invention is generally in the field of control systems. More specifically, the present invention is in the field of use of pulse width modulation in a control system. This specification herein exemplifies the present invention by an open loop, and subsequently, a closed loop digital power supply embodying voltage or current regulation.

2. Background Art

For more than half a century, control system engineers have implemented pulse width modulation schemes for driving a regulated voltage or current from a control plant. Control system engineers of ordinary skill in the art have long since designed digital open loop pulse width modulation control schemes to power loads that do not require precise voltage or current regulation. These digital open loop pulse width modulation control systems generally have powered loads such as DC motors, or heating elements, or other inductive and/or resistive loads which tolerate a system step response exhibiting large overshoot, for instance in excess of fifty percent beyond the set-point. Given a load that tolerates such step responses of extreme overshoot, digital open loop pulse width modulation design offers advantages of substantial cost savings in terms of reduced component count and ease of implementation due to modest design complexity.

Recently, advances in semiconductor integrated circuit fabrication processes have given rise to integrated circuits requiring separate power supplies for various parts including a voltage for the input/output pad ring, and a second, unique power supply voltage for the digital core. While this advancement brings the advantage of reduced core power consumption, there arises the problem of regulation of these additional voltages. With the advent of system-on-chip technologies, designers of these devices have only begun to address this requirement for regulating multiple power supply domains on-chip. U.S. Pat. No. 6,940,189 addresses an implementation of a digital open loop pulse width modulation control system as an optimal means to reduce costs and enhance power efficiency of the total system-on-chip solution. The aforementioned reference patent does not address the problem of overshoot in the step response of the switch mode power supply powering the core voltage domain. The semiconductor core voltage exemplifies a capacitive and resistive load requiring precise regulation of voltage and thus typically tolerates voltage excursions of five percent or less beyond its given set-point.

Therefore, there exists a need for a novel low cost, high power efficiency, and reliable pulse width modulation algorithm that overcomes the problem of overshoot in step response while providing power to loads typically requiring precise regulation such as semiconductor cores.

SUMMARY OF THE INVENTION

The present invention is directed to a novel but readily comprehensible algorithm implemented with tools commonly in use by a control engineer of ordinary skill in the art. The present invention depicts such an algorithm using these tools to create a specific pulse width modulation sequence that generates a near critical damped step response in a second order or higher order linear or non-linear system that otherwise would exhibit an under damped step response. The present invention exemplifies the use of tools and method for integrating a semiconductor die of plural power supply voltage domains with an open loop, and subsequently, a closed loop switch mode DC-to-DC converter to obtain optimal power savings, and minimal heat dissipation and component cost.

In addition, the present invention is not limited to application to the exemplary system. The present invention may be applied to control of any second or higher order system mathematically analogous to pulsed control and requiring near critical damped step response. Any electrical, mechanical or electromechanical system under the mathematical analogue of pulsed open loop control may especially benefit from the present invention whereby without the present invention, open loop control could result in a characteristically under damped step response thus rendering such a topology undesirable and the cost benefits and ease of implementation of such open loop topology unrealizable. The present invention places only the design requirements of use of control plant component values of +/−10% tolerance and reasonably accurate estimates of the load of the system, with tolerance of +/−25% depending upon how near to the ideal response time and how much overshoot the system can withstand i.e. the load regulation specification of the control system.

BRIEF DESCRIPTION OF THE DRAWINGS

FIG. 3 illustrates the equations describing the system, a coefficient, and a pulse sequence that results in a near critical damped step response from the circuit of FIG. 1.

FIG. 5 illustrates a snippet of simulation code generated by the spreadsheet computer program of FIG. 4.

FIG. 6 illustrates general equations describing a pulse sequence that results in a near critical damped response to a step in any direction in a practical non-ideal system.

DETAILED DESCRIPTION OF THE INVENTION

The present invention pertains to a control system and algorithm for generating a near critical damped step response using pulse width modulation techniques in an inherently under damped system. The following description contains specific information pertaining to various embodiments and implementations of the invention. One skilled in the art will recognize that one may practice the present invention in a manner different from that specifically depicted in the present specification. Furthermore, the present specification has omitted some of the specific details of the present invention in order to not obscure the invention. A person of ordinary skills in the art would have knowledge of the specific details not described in the present specification. Obviously, one may omit or only partially implement some features of the present invention and remain well within the scope and spirit of the present invention.

The following drawings and their accompanying detailed description apply as merely exemplary and not restrictive embodiments of the invention. To maintain brevity, the present specification has not specifically described other embodiments of the invention that use the principles of the present invention and has not specifically illustrated other embodiments in the present drawings.

Figure 1:
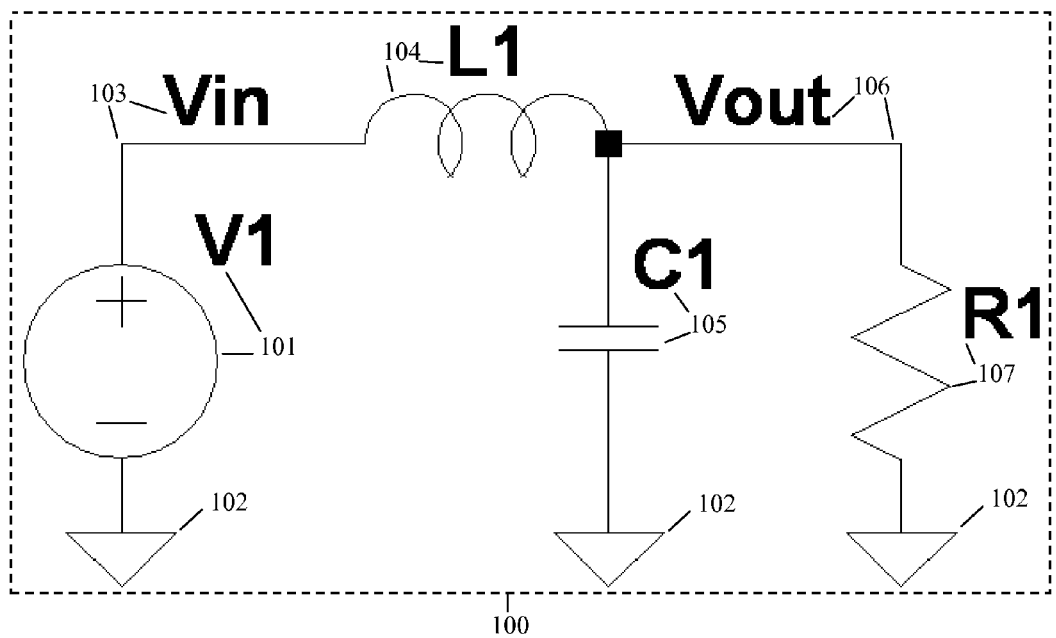
FIG. 1 illustrates a schematic view of an ideal exemplary structure in accordance with one embodiment of the present invention.

FIG. 1 illustrates a schematic of an ideal embodiment of the present invention. Block 100 represents the control plant implemented with ideal models of an exemplary embodiment of the present invention. The exemplary embodiment within block 100 consists of the typical step-down switch mode power supply components that constitute a canonical parallel resonant LRC circuit well understood by one of ordinary skill in the art. In block 100, the input power supply and the controlled switching element have been modeled as an ideal pulsed source 101 referenced to ground 102 and feeding power into the remaining system components from the node entitled Vin 103 through the inductor 104. The node entitled Vout 106 connects the inductor 104 and the output capacitor 105 referenced to ground 102 and forming the energy storage and filtering elements that transform the switched Vin 103 to a DC output Vout 106 that powers the load modeled as a resistor 107 referenced to ground 102. For over a century and a half engineers have successfully analyzed the parallel resonant LRC circuit this model in block 100 represents using ordinary second order differential equation analysis techniques, with the exact solution depending upon values of the L1 104, R1 107, and C1 105, with respect to each other. Three solutions for the ordinary second order differential equation describing the time domain response to a step forcing function exist each for unique cases: over damped; under damped; and critical damped. The present invention does not address the case of the over damped response which exhibits no overshoot above the set-point and thus presents no danger of exceeding an upper limit of specified load regulation, but does perform less than optimally in regard to slow response time. Thus, the present invention presumes the engineer designing such a system would likely avoid sub-optimal over damped performance, leaving the two remaining cases to consider. The present invention does address the two remaining cases, under damped and critical damped response in such a model 100 and analogous systems.

Figure 2:
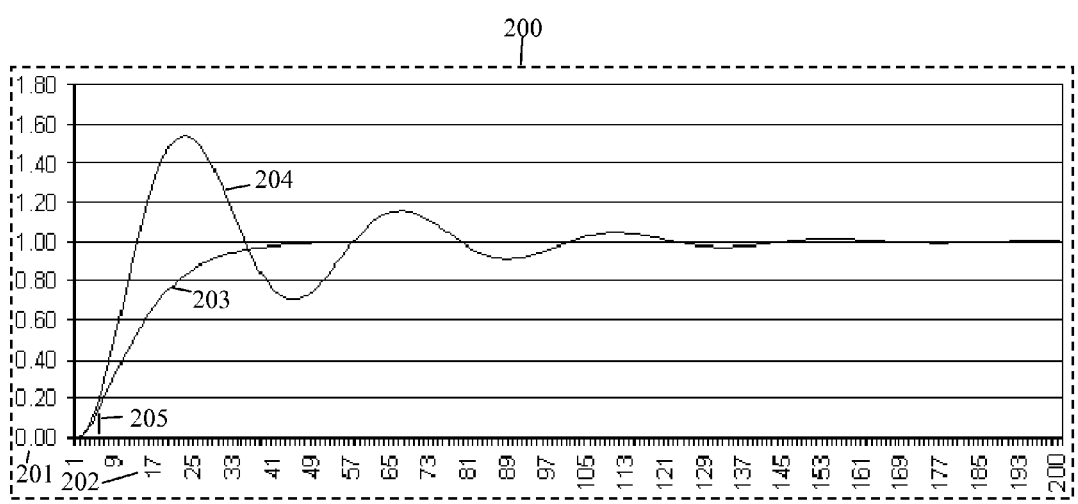
FIG. 2 illustrates a time domain graphical representation of the step response to pulse width modulation in the structure in FIG. 1.

FIG. 2 depicts both an example of an under damped 204 and an example of a critical damped 203 step response in plot 200. The vertical axis 201 represents a normalized set-point scale whereas the horizontal axis 202 represents time given in units of an arbitrary switching period. The degree to which the step response goes under damped coincides with a damping factor of approximately 0.23, overshooting by more than 55% and one can commonly find this sort of step response given typical switch mode power supply components configured in an open loop topology. A particular point of interest along the plot 200 of the two different step responses one may note includes the point 205 where the responses begin to deviate by approximately 5% from each other.

FIG. 3 details equations including: equation 301 describing time domain critical damped step response; equation 302 describing the sequence of duty cycles in a pulse train that results in a critical damped response for the circuit in block 100 of FIG. 1; a definition 303 of one of the parameters of equation 302; a time domain system equation 304 representing the circuit in block 100 of FIG. 1; and equation 305, the general form of the time domain input signal that results in a critical damped step response for the circuit in block 100 of FIG. 1. The variable $v_o(t)$ in equation 301 represents the time variant output voltage synonymous with Vout 106 in the model 100 of FIG. 1. Likewise, Vin in equation 301 represents the amplitude of the input voltage synonymous with the amplitude of Vin 103 in the model 100 of FIG. 1. The coefficient AOF corresponds to the gain of an amplifier with feedback, which one of ordinary skill in the art has known to ideally behave analogously to a parallel resonant LRC circuit. Thus, in the immediate example, one may consider the coefficient AOF equivalent to the duty cycle required to obtain a desired set-point in an ideal pulse width modulated control system 100. The two remaining variables, t and ωo, one may immediately recognize as time in seconds, and the resonant frequency in radians per second, commonly known most directly equal to one over the square root of the value of L1 104 times C1 105, respectively.

The present invention's substantial departure from prior art and significant novelty exists in the preferred embodiment wherein during the design of a control system the designer applies the right hand side of equation 301 to scale the duty cycle of the pulse sequence as shown in equation 302. Here the inventor introduces the coefficient $A_{VO}$, as defined in equation 303 where both the numerator and denominator consist of DC amplitudes, to stand for the voltage gain required to obtain a desired set-point in an ideal pulse width modulation control system 100 thereby removing any implication of feedback in the topology as one may unnecessarily infer from the coefficient $A_{OF}$ of equation 301. While in its strictest mathematical sense, u(t) fails to meet the requirements of a function, engineers have referred to u(t) as the unit step forcing function as a widely accepted artifice, and this specification will use u(t) in such a conventional manner hereinafter. The discrete variable n, denotes an integer number of switching periods $T_{SW}$, the inverse of the switching frequency, in which the duty cycle initially assumes its final value in order to obtain the desired voltage gain set-point. During the innovation process, the inventor discovered this initial time period of duration equal to n, times $T_{SW}$ at the set-point pulse width provides a precise amount of power to initiate a near critical damped step response. The inventor also discovered this time period corresponds to the point 205 where the critical damped and under damped responses begin to deviate by approximately 5% from each other in an ideal second order system model 100. As suggested by equation 304, one may prove using the mathematical operation of convolution that the pulse train defined by its duty cycle in equation 302, using its formal definition as an input signal in equation 305, provides a near critical damped step response, $y_m(t)$ in equation 304, synonymous to Vout 106 in model 100 of FIG. 1, in a system 100 that would otherwise exhibit an under damped response had a step directly to the desired duty cycle set-point occurred. In equation 304, h(t) represents the system 100 impulse response equivalent to the derivative with respect to time of $y_m(t)$ when $x_m(t)$ equals a unit step forcing function, u(t). The subscript m in equation 304 implies a unique response $y_m(t)$ associated with a unique input $x_m(t)$ for each transition in system state m indexes. The discrete variable $n_2$ in equations 302 and 305 signifies an offset in time in the application of the critical damped response scaling function from the time at which one applies the scaling to the duty cycle. Therefore the discrete variables $n_1$ and $n_2$ as introduced in equations 302 and 305 carry out the resulting purpose of coarse and fine tuning in the time domain, respectively, to bring the system step response, once tuned, closer towards a critical damped response.

One should note the only subtle difference between equation 302 and 305 exists in that equation 302 assumes the initiation of the step change occurs precisely at t=0 seconds whereas equation 305 allows the initiation of the step change to occur delayed sometime $t_0$ after t=0. This subtle difference implies step changes subsequent to initial power-on of the control system may attain similar critical damped response through application of the same scaled pulse width modulation input per equation 305. This specification of the present invention examines these additional power state transitions and further general form equations that describe how to attain critical damped step response for higher order systems in subsequent paragraphs describing FIG. 6.

Figure 4:
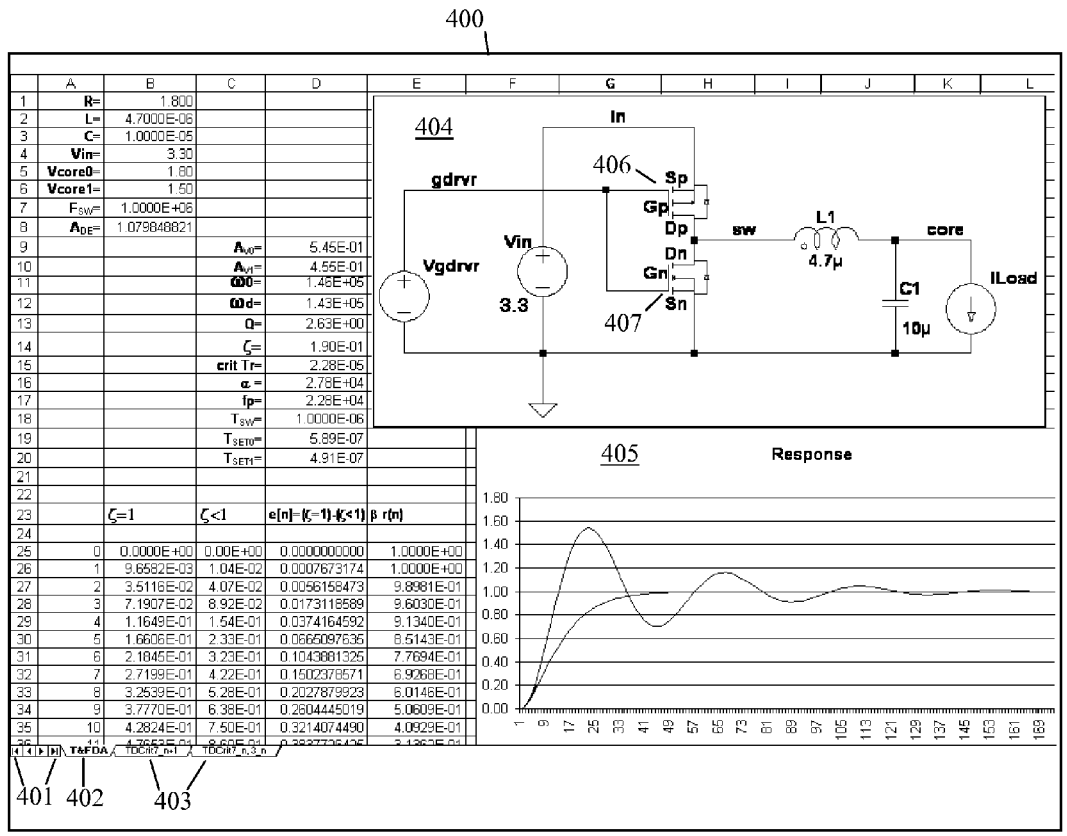
FIG. 4 illustrates a view of a spreadsheet computer program that generates a pulse width modulation sequence according to one embodiment of the present invention.

FIG. 4 shows a view of a spreadsheet 400 computer program that serves as an analysis tool to the designer, as well as a means to generate the pulse width modulation that results in a near critical damped response, for an inherently under damped system. In a typical spreadsheet 400, graphical user interface buttons 401 enable the user to navigate from the top sheet 402 to subsequent sheets 403. The specification will herein discuss the top sheet 402, and following paragraphs will discuss the subsequent sheets 403. This specification will make use of typical spreadsheet 400 cell reference conventions, such as cell A1 referring to the location where the user entered the text "R=" and in this example, B1, the location where the user entered the value of R. Clearly, the user entered the parameters as defined in FIG. 1; in addition, the spreadsheet 400 of FIG. 4 shows a schematic plot 404, and a response plot 405 illustrative of the ideal under damped and critical damped response of the exemplary control system under development. As one may readily notice, the schematic plot 404 inserted onto the top sheet 402 of the spreadsheet 400 has replaced the ideal switching element, pulsed source 101, with a physical model of two switching transistors 406, 407 and a model of a pulse width modulation controller labeled Vgdrvr to drive the gates of the physical transistors 406, 407. While the ideal model 100 of FIG. 1 embodies a second order linear system, because the physical model of the two switching transistors 406, 407 incur frequency dependent losses, one would immediately recognize the schematic plot 404 thus portrays a model of a higher order system. Furthermore, all the plant elements, L1, C1, and the switching transistors 406, 407 of schematic plot 404 match the values of the exemplary switch mode power supply given in columns 13 and 14 of the reference patent U.S. Pat. No. 6,940,189. This design example represents one of many possible configurations within the scope of the present invention and one must view this configuration as exemplary, not restrictive.

In proceeding from the ideal model 100 of FIG. 1 to the physical model 404 of FIG. 4, the discussion will now concern the parameters entered into the cells of spreadsheet 400 and particularly the new parameters not considered in previous discussions of ideal models. Cells A1 down to A8 comprise the names of physical parameters the designer enters into the spreadsheet 400 with the actual values of those parameters entered into corresponding cells B1 down to B8. Likewise, formulae reside in cells D9 down to D20 computing other parameters necessary for further computation in the formulae that create the points in the response plots 405 along with the formulae that generate the simulation code for use within a Simulation Program with Integrated Circuit Emphasis commonly known as SPICE to those of ordinary skill in the art. The notion of generation of SPICE code alludes to a quick method of verifying the nearness to critical damped response whereas this specification previously suggested a mathematical computation tool that may perform such an operation as convolution which could equally perform the task of verifying nearness to critical damped response. The approach incorporating the use of SPICE offers the advantage of having graphical or syntactic symbols of plant elements usually within a library physically characterized by vendors of such parts with which the user more directly simulates higher order systems in a hierarchical fashion versus laboring with a mathematics tool over behavioral models of questionable accuracy. Nonetheless, while probably less productive for certain applications, the use of a mathematical computation tool which performs symbolic convolution may hold advantages or provide the only means of system modeling in certain applications and thus remains well within the scope and spirit of the present invention. The names of the computed parameters in cells D9 down to D20 appear correspondingly in cells C9 down to C20. As previously stated, the user enters parameters into cells B1 down to B8 as follows: R, the resistive model for the load in cell B1; L, the inductance value in cell B2; C, the output capacitance in cell B3; Vin, the fixed DC input voltage in cell B4; Vcore0, the output DC voltage in this particular example to which the system first transitions, in cell B5; Vcore1, the output DC voltage to which the system transitions after Vcore0, in cell B6; $F_{SW}$, the switching frequency of the system, in cell B7; and ADE, a coefficient which compensates for dynamic error caused by loss from non-ideal behavior in the physical switching elements, in cell B8. This specification will provide further detail as to the mathematical basis for use of such a compensation coefficient as ADE in subsequent paragraphs discussing FIG. 6. From these input parameters, the spreadsheet 400 computes intermediate parameters as displayed in cells D9 down to D20.

These intermediate parameters include: $A_{V0}$, the ideal voltage gain for the first power state obtained by dividing Vcore0 by Vin, in cell D9; $A_{V1}$, the ideal voltage gain for the second power state in this particular example, obtained by dividing Vcore1 by Vin, in cell D10; $\omega_0$, the resonant frequency in radians per second given by one over the root of the quantity L times C, in cell D11; $\omega_d$, the damped frequency given by the resonant frequency times the root of the quantity one minus the damping factor, in cell D12; Q, the quality factor, given by R over the quantity L times the resonant frequency, in cell D13; $\zeta$, the damping factor, in some texts symbolized as "k" in other texts a lower case zeta as shown, with both of these symbols used interchangeably hereinafter, given by one over two Q, in cell D14; $T_r$, the critical damped rise time from 10% to 90% of the set-point given by 3.33 over $\omega_0$, in cell D15; $\alpha$, the exponential damping coefficient also known as the neper frequency, given by one over the quantity of two RC, in cell D16; fp, the pole frequency given by the damped frequency divided by two π, in cell DI 7; $T_{SW}$, the switching period given by one over the switching frequency, in cell D18, and $T_{SET0}$, $T_{SET1}$, the time period of a pulse width that provides the desired set-point given by the switching period times the ideal voltage gain times the dynamic error compensation coefficient, in cells D19 and D20 respectively. The immediate method of system analysis or synthesis of critical damped response may not use all of these intermediate parameters, but these parameters may provide insight to one familiar with other analysis methods including but not limited to root locus and pole zero matching. In the remaining cells of the top sheet 402, one can view the value of the lo discrete variable n, the index of summation in equation 305, starting from cell A25 and proceeding downward. Cell B23 and cell C23 identify the columns below as the normalized critical damped and under damped step response functions by their properties of damping factor range, respectively, with the actual points of the response plots 405 occupying the cells starting at cell B25 and cell C25 and continuing downward corresponding in time to the value of n to the left times the switching period $T_{SW}$. Cell D23 identifies the error in terms of the magnitude of the difference of the critical damped response minus the under damped response, with the points of this error function starting at cell D25 and continuing downward. Finally, cell E23 identifies the column starting at E25 comprising the normalized value of the input signal into the plant that a hypothetical feedback network, synthesized using the prior art pole zero matching method, affects when such a network receives the under damped response as depicted in column C starting at cell C25. Empirical results indicate the pole zero matching feedback network performs sub-optimally with substantially slower response times than the near critical damped response generated by the pulse width sequence of the present invention.

FIG. 5 represents an example of a code sheet 500 from the subsequent sheets 403 that generate SPICE executable simulation code based upon the values entered into columns B1 down to B8 on the top sheet 402 of the spreadsheet 400 in FIG. 4. The designer of the exemplary control system copies the entire text of the simulation code sheet 500 into a text window of the graphical user interface of a SPICE simulation program or saves the code sheet 500 as a separate text file to run within SPICE in command-line mode, as the final step of the analysis and verification iterative process. While this specification will not offer much reference to the syntax of SPICE, the discussion will now turn to the individual lines of code labeled with a reference designator from 501 down to 523. While various versions of SPICE generally do not permit line numbers as shown, this specification includes reference designation line numbers 501 down to 523 as a matter of convenience and compliance to 37 C.F.R. § 1.84(p). Line number 501 down to line 504 specify the physical model of the inductor is L1, the capacitor C1, the DC input voltage Vin, and the switching transistors 406, 407 with the interconnection of these plant elements as previously graphically depicted in schematic plot 404 of FIG. 4. Lines 505 down to 507 appear as comments as indicated by the "*" for the first character in the line. Line 505 indicates the two values of discrete variable $n_1$: the first value equal to seven, the second value equal to three; and the set-point pulse widths for two transitions of power states for this given simulation. Line 506 essentially indicates the discrete variable $n_2$ has a value of zero for both transitions. Line 507 denotes the polarity of the top Field Effect Transistor 406 in the switching element 406, 407, and as such requires a logic inversion of the gate driver output signal gdrvr in order for proper operation of the exemplary switch mode power supply per the reference patent U.S. Pat. No. 6,940,189. One should take particular interest in lines 508 down to line 518 as these lines represent the output signal from the model of the gate driver and pulse width modulation controller Vgdrvr with pulse widths computed by the spreadsheet per the values entered in cells B1 through B8 of the top sheet 402. Lines 508 down to line 514 demonstrate how the discrete variable n, affects the pulse width as one can readily observe the values for the turn-off time of the top transistor 406 ending in the number sequence 5890 repeating for seven lines corresponding to $n_1$ equal to seven. The pulse width sequence continues from line 515, with the set-point pulse period scaled by lo the critical damped step response function starting with the scaling factor in cell B33 of the top sheet 402 and continuing downward. The ellipsis 516 merely indicates a discontinuity in FIG. 5 wherein an arbitrary number of lines of code, excessive for this drawing figure to exhaustively list, would define the behavior of the model of the gate driver and pulse width modulation controller Vgdrvr throughout the time of the simulation. Lines 517, 518 show the last two lines of the piece wise linear time domain description of the model of the gate driver and pulse width modulation controller Vgdrvr that started on line 508. In lines 517, 518 one can see the time values for the turn-off time of the top transistor 406 ending in the number sequence 4908 having reached its the terminal value of the second set-point after the second transition in this given simulation. Lines 519 and 520 alternately affect the simulation in that line 519 describes Iload, a physical model of a non-linear capacitive load resembling that of the semiconductor core of this exemplary system under development, whereas line 520, commented out as per the "*" first character, describes a simple resistive load such as RI 107 of FIG. 1. As the user desires to characterize deviations from the initially estimated load, commenting out line 519 and inserting line 520 facilitates variation of load, in this immediate example, changing the resistance value of 1.8 ohms in line 520 to alternate values. For further verification of physical system functionality, one may replace lines 520 and 521 with a piecewise linear time domain description for Iload, similar to the previously mentioned PWL statement starting from line 508 down to line 518. In this manner, the designer may physically simulate the actual load, with data stored on a digital storage oscilloscope captured empirically from a characteristic load. Likewise, the user may alter the physical parameters of L1 in line 501 and C1 in line 502 to conveniently characterize deviations from initial estimates and model different physical conditions. Subsequent paragraphs in this specification reveal results of variations in various parameters for this exemplary system under development. Line 521 refers the SPICE simulator to the previously stated physically characterized library for the switching transistors 406, 407. Line 522 simply indicates to SPICE the intended time domain transient analysis of 200 microseconds duration while line 523 fulfills a simple syntactic necessity.

FIG. 6 extends the equations introduced in FIG. 3 beyond an ideal second order system towards a higher order physical system as portrayed in the schematic plot 404 of FIG. 4 while also incorporating both transitions from lower to higher and higher to lower power states. One may immediately notice the resemblance equation 601 describing the duty cycle sequence of a transition from a lower to higher power state shares with equation 302. The subtle difference of including a "+" subscripted $D_+(n)$ indicates the duty cycle as a function of discrete time having relevance in a transition from a lower to higher power state, i.e. duty cycle increasing with time. The inclusion of the dynamic error compensation coefficient, ADE, as a factor for the duty cycle over all time stands as the only other difference that equation 601 holds apart from equation 302. Here FIG. 6 mathematically defines the dynamic error compensation coefficient, $A_{DE}$, in equation 602, relation 603, and applies ADE in equation 604 to define the voltage $V_{SW}$ at node sw as shown in the schematic plot 404 of FIG. 4. The need for such a dynamic error compensation coefficient arises due to traversing from the ideal second order model to a physical higher order model, and accounts for switching frequency dependent dynamic losses incurred in the physical switching elements. Note that equation 602 implies the designer obtains the value of $A_{DE}$ after simulating a non-ideal switching element such as that depicted in schematic plot 404 of FIG. 4, after having previously applied the ideal voltage gain coefficient, $A_{V0}$, and the power state transition has settled to its final value. The relation 603 implies direct proportionality of $A_{DE}$ to switching frequency, to output voltage with respect to the input voltage, and to the output current. While the previous example treated $A_{DE}$ as a constant, $A_{DE}$ may vary from one power state to the next as implied in equation 610 as a function of the output voltage with respect to the input voltage as well as a function of the output current per the relation 603. Although all the examples in this specification illustrate voltage changes, relation 603 clearly indicates the control system in the scope of the present invention must also manage substantial changes in output current, thus affecting $A_{DE(p)}$ per relation 603 and equation 610, in the same manner as voltage changes. The iterative process of analysis and verification including SPICE simulation determines how substantially any change in current or voltage affects $A_{DE}$ and thus if the change requires application of a transition function that equations 302, 305, 601, and 605 through 609 describe. In the exemplary system under development the range of output currents and voltages differed within limits allowing a constant $A_{DE}$ across all power state transitions to maintain accuracy to within approximately one-third of a percent of the desired set-point. This specification will detail these results in subsequent paragraphs.

Equation 605 of FIG. 6 simply applies equation 601 to obtain a general form of the output signal of the gate driver and pulse width modulation controller Vgdrvr, in the same fashion equation 305 applies the equation 302 of FIG. 3 for the ideal model. As before in the aforementioned equations of FIG. 3, in FIG. 6 equation 605 allows the power state transition to occur at any time $t_0$ whereas equation 601 presumes the transition occurs at t=0. In equation 605, $V_{SW}$ replaces $V_{in}$ of equation 305 since equation 605 introduces $A_{DE}$ per equation 604 as a factor compensating for the dynamic losses through the physical switching element, and thus allows equation 605 to retain the mathematical precision given in the ideal model of equation 305.

Equation 606 introduces the duty cycle sequence of a transition from higher to lower power state and identifies the transition as going from a higher to a lower power state by stipulating the condition $A_{V0}>A_{V1}$. Equation 607 likewise stipulates $A_{V1}>A_{V0}$ in the way it introduces a general form duty cycle sequence for a transition from lower to higher power state. Obviously if the designer sets $A_{V0}$ equal to zero, one then may algebraically reduce both equations 606, 607 to equation 601.

Equations 608 and 609 once again provide a general form of the output signal of the gate driver and pulse width modulation controller Vgdrvr resulting from equations 606, 607, in the same fashion equation 305 applies the equation 302 of FIG. 3 for the ideal model. Here equations 608, 609 introduce $T_{Set(p)}$ as the set-point pulse width defined in terms of equation 610, where p indexes the discrete power states and thus these equations describe a means to generate a near critical damped response for $y_m(t)$ in equation 304 for any arbitrary transition m proceeding from any power state p to any power state p+1. Also one may readily observe substituting $\Delta T_{Set(p)}$ from equation 611 into equations 608, 609 reduces both equations 608, 609 to a single general form solution for a near critical damped response. The benefit equations 608, 609 offer in their separate forms avoids potential confusion caused by terms of negative time value.

Finally, the relation 612 indicates the magnitude of the change in pulse width time period has direct proportional effects on the discrete variables $n_1$, $n_2$ in the above equations 606 through 609, where $n_1$ and $n_2$ affect a coarse and fine tuning in the time domain, respectively, towards a critical damped response. Progressing to a higher order physical model from an ideal second order model also affects the value of $n_1$ and $n_2$, which further accentuates the necessity of the iterative simulation analysis and verification process.

Figure 7:
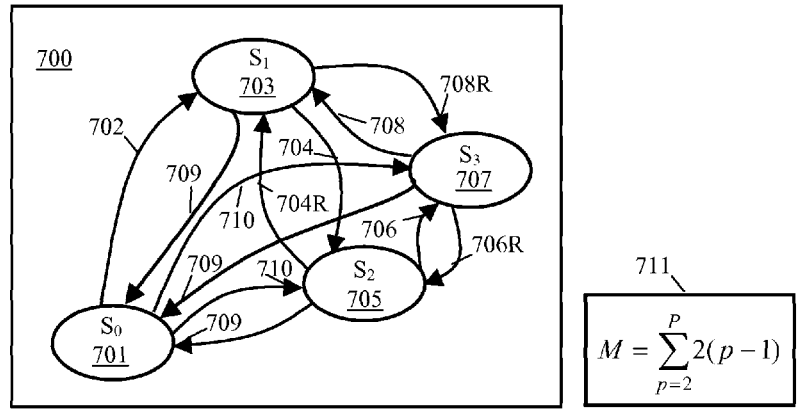
FIG. 7 illustrates a state transition diagram of a hypothetical system operating in is various states under the control of one embodiment of the present invention.

FIG. 7 illustrates a canonical general state transition diagram 700 for which this specification will now briefly discuss the application of the equations and relations of FIG. 6. As this specification previously alluded, fundamental to the control system design process, the designer first enumerates all power states 701, 703, 705, 707, and transitions 702, 704, 704R, 706, 706R, 708, 708R, 709, 710 in the state transition diagram 700. From the state transition diagram 700, the total number of possible transitions, M, in general appears to grow by the summation given by equation 711 where, as before, p stands for the index to discrete power states with P denoting the total number of power states. However, properties of physical systems in general as described in the equations of FIG. 6, allow substantial reduction in complexity. Assuming in the immediate example of diagram 700 the transition from no power whatsoever to the lowest idle power state $S_0$ 701 requires no intervention by the control system, all transitions 709 to power state $S_0$ 701 require no algorithmic control, performed merely by the act of removing the power the control system delivers. In most systems, the transition from the idle power state $S_0$ 701 deterministically occurs resulting in the same power state. In the example of this diagram 700, transition 702 resulting in power state $S_1$ 703 renders possible transitions 710 non-existent, allowing further reduction in complexity. The fact that the expression ATSet(p) from equation 611 when substituted into equations 608, 609 reduces equations 608, 609 into a single equation demonstrates symmetry when any two pulse width changes have equal magnitude. This mathematically demonstrated symmetry as indicated by relation 612 thus implies a practicable reduction of the actual total number of unique power state transitions M in equation 711 by a factor of two. In the immediate example of FIG. 7, this implies any transition and its return path, such as transition pairs 704 and 704R, 706 and 706R, and 708 and 708R, essentially comprise the same parameters in their descriptive equations 606 through 609, with merely changing the operation of adding or subtracting the scaled $|\Delta T_{Set(p)}|$, thus reducing non-volatile memory requirements or computational complexity for the overall control system.

Given all these aforementioned reductions in total number of state transitions for which to design, the designer now faces the choice of computation-intensive versus memory-intensive implementations. For the exemplary system under development, the inventor empirically found in the column starting at cell B25 of top sheet 402 of critical damped scaling factors of the pulse width set-point time period, the value N, the practical upper limit of summation in equations 305, 605, 608, 609, equals 63. In other words, the exponential scaling function: $(1-(1+\omega_0(n+n_2)T_{SW})e^{-\omega_0(n+n_2)T_{SW}})$ equals 99.9% when $n+n_2=63$, or the pulse widths have reached 99.9% of the desired set-point width at that point in time for this particular example. The limit N+1 carries importance in determining the length requirement of the column starting at cell B25 of top sheet 402 comprising critical damped scaling factors of the pulse width set-point period. The length of this column directly affects the size of a look-up table in non-volatile memory, as one would ordinarily not consider adding the complexity of computing, during every state of the state machine providing control of the system during transition, the exponential scaling function: $(1-(1+\omega_0(n+n_2)T_{SW})e^{-\omega_0(n+n_2)T_{SW}})$ found throughout as terms in equations 302, 305, 601, 605 through 609. Hence, while a control system embodied within the scope of the present invention could possibly comprise no non-volatile memory whatsoever, this specification considers the least memory-intensive practical application of the present invention to comprise at least enough non-volatile memory or a register file in logic to store a single instance of the above exponential scaling function holding N+1 scaling factors per any one of the equations 305, or 605, or 608, or 609. In the least memory-intensive practical application of the present invention, as stated in the previous paragraph, one may achieve the reduction in non-volatile memory requirement through taking advantage of the symmetry of equations 608, 609 with respect to magnitude of pulse width change $|\Delta T_{Set(p)}|$, given in equation 611 and relation 612. Thus, a state machine may execute the alternate operations of adding or subtracting the scaled $|\Delta T_{Set(p)}|$ in order to reduce memory requirements and computational complexity for the stored N+1 exponential scaling function scaling factors. Given this same state machine model of least memory-intensive application of the present invention, one may provide for differences in the discrete variables $n_1$, $n_2$ from one transition to another by altering pointers to the memory addresses of a single transition's worth of N+1 stored exponential scaling function scaling factors. Actually, in general the designer may decrease the total number of memory locations of scaling factors to $N+1-n_{1(min)}$ where $n_{1(min)}$ represents the lowest value of $n_1$ for all possible transitions in any system under development. To make a physical example of this least memory-intensive application of the present invention, this specification will now assume a non-volatile memory resource having 8192 bits of digital storage for the exemplary system under development. Given the novel approach of the present invention, the minimal amount of parameters needed to describe any one unique power state transition could reside in three memory locations, one for $n_1$, one for $n_2$, and one for $|\Delta T_{Set(p)}|$. With eight bits per word required to express the N+1=64 words of exponential scaling factors applicable to all of the transitions for the exemplary system under development, this leaves 7680 bits remaining for storage of other parameters to describe unique transitions. Given eight bits per word describing the N+1=64 exponential scaling factors, and four bits for each of the aforementioned $n_1$ and $n_2$ parameters, that allows 480 unique transitions. The resource limitation allowing 480 unique transitions constrains the system to thirty-one discrete power states allowable according to the ceiling function defining P derived from evaluating equation 711, considering halving of memory requirements by implementing the aforementioned alternate addition or subtraction operations for symmetric transitions.

In contrast, a least computation-intensive implementation of the present invention requires no computation whatsoever while the state machine controlling the system during transitions merely points to any one of M times (N+1) unique scaled pulse widths desired at that time. In this least compute-intensive application of the present invention, the memory requirement entails M transitions worth of N+1 instances of exponentially scaled pulse periods per any one of the equations 305, or 605, or 608, or 609. Once again, the designer may further decrease the total number of memory locations for each one of the M transitions to $N+1-n_1$ for each $n_1$ unique to each possible transition in the exemplary system under development. For the physical example just presented, having 8192 bits of memory with N+1=64 six-bit words per transition per the exemplary system, this allows M=21 transitions, which constrains the system to five discrete power states allowable according to the ceiling function defining P derived from evaluating equation 711. The present invention applied to the exemplary system under development has not only faster response times, but also the design may demand lesser memory requirements and less computational burden than prior art applied pole zero matching techniques of an externally closed loop. Of course, one may selectively realize any combination of the aforementioned features from both memory-intensive and computation-intensive implementations and remain well within the scope and spirit of the present invention.

The choice of six or eight bit words in the above examples stems from the exemplary system of the reference patent, having a 25 MHz system clock from which to derive pulse width modulation at a 1 MHz switching frequency. Even when the state machine controlling the system during transitions uses both edges of the 25 MHz system clock to improve pulse width modulation resolution, this provides only 2% accuracy for a switching frequency of 1 MHz, greater than the error accumulated using eight bit words for the parameters in the transition functions in the computation-intensive example. This low time base accuracy inherent in the system results in what one of ordinary skill in the art may refer to as quantization error. A designer of a system within the scope of the present invention may employ several well-understood methods to reduce such quantization error including the method of dithering. Dithering involves alternating in short periods of time between two or more adjacent output codes in order to attain an average output value of greater precision existing between the ordinary output codes realizable without the method of dithering. For the exemplary system under development, when the state machine controlling the system during transition encounters a sequence in the look-up table of pulse width scaling factors for which the present embodiment can practically only attain less accuracy than 1%, the state machine may dither between several adjacent pulse widths over the course of this sequence time to improve accuracy. The typical sequence where dithering may enhance accuracy for this example could exist in the time period describable by equations 305, 605, 608, 609 as from the time $t=t_0$ until $t=t_0+n_1T_{SW}$, and also as the exponential scaling function begins to is flatten out at 80% near the set-point, as well as during steady state operation. Thus, dithering can also provide another benefit of reducing the scaling function memory requirement of the system. A designer of a system within the scope of the present invention may also simply utilize dithering when changing the pulse width, $|\Delta T_{Set(p)}|$, to accommodate change in output current or voltage that does not result in a response substantially differing from critical damped response, thus not requiring application of a transition function that equations 302, 305, 601, and 605 through 609 describe. Here dithering can again provide the benefit of reducing the scaling function memory requirement of the system. In both open or closed loop implementations, dithering offers several additional advantages aside from reducing quantization error and memory requirements. In steady state operation, dithering disperses the frequency spectrum of pulse width modulation into smaller peaks over a wider band giving the side benefit of diminishing electromagnetic emissions from the overall system. Closed loop systems may suffer a phenomenon known by one of ordinary skill in the art as limit cycle oscillation, caused by insufficient output resolution with respect to input resolution in such control systems, which output dithering can prevent. Thus, any embodiment within the scope of the present invention may apply dithering for any of the aforementioned benefits including reducing system memory requirements, reducing electromagnetic emissions, reducing quantization error or enhancing pulse width modulation resolution in an open loop system, or eliminating limit cycle oscillation in a closed loop system. The specification will discuss an exemplary application of the present invention in a closed loop topology in a subsequent description of FIG. 22.

Figure 8:
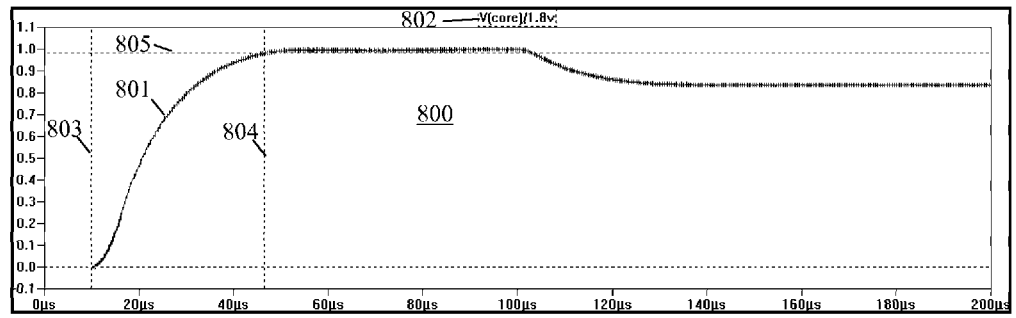
FIG. 8 illustrates a time domain plot of possible transitions in a hypothetical system operating under the control of one embodiment of the present invention.

FIGS. 8 through 21 provide results from varying physical parameters during simulation and thus further define "nearness" to critical damped response in an actual realizable system. FIG. 8 illustrates a time domain response plot 800 from a simulation comprising two transitions of power states for an exemplary embodiment of the present invention. As shown in the response plots 200, 405, of FIG. 2 and FIG. 4, respectively, the vertical axis of response plot 800 of FIG. 8 displays a normalized set-point scale for the amplitude. The horizontal axes of the response plots of FIGS. 8 through 21 now differ from the horizontal axes in plots 200, 405 of FIG. 2 and FIG. 4 in that the horizontal axes of the plots in FIGS. 8 through 21 now display units of time in microseconds whereas before the horizontal axes displayed integer multiples of $T_{SW}$ switching periods. The legend 802 affixes a physical value of 1.8 volts to the normalized set-point value for this particular example. The horizontal cursor 805 gauges the response curve 801 rise to within 2% of the normalized set-point, in a period that vertical cursor 804 minus vertical cursor 803 delineates. In this particular exemplary transition, given a pulse sequence describable by equations such as equation 609 with parameters $n_1$ equal to seven and $n_2$ equal to zero driving plant component values as defined in the reference U.S. Pat. No. 6,940,189, the resultant rise from 0% to 98% set-point amplitude occurred in 36.61 microseconds. One can readily see practically no evidence of overshoot, well below 1%. Manipulating the cursors 803, 804 similarly as shown in the lo plot 800, one may find other qualifiers for rise time, such as the customary metric of rise time from 10% to 90% set-point amplitude as calculated in cell D15 of the top sheet 402 of the spreadsheet 400, empirically found to equal 22.59 microseconds in this simulation plot 800. This empirically found value of customary 10%-to-90% set-point amplitude rise time coincides with the theoretical critical damped rise time of 22.8 microseconds is calculated in cell D15 of the top sheet 402.

One may consider another equally useful measurement of rise time from 0%-to-95% amplitude for an exemplary system allowing +1-5% regulation tolerance, this time could indicate an empirically proven "power-good" time after the initiation of a transition of certain magnitude $|\Delta T_{Set(p)}|$. This particular simulated transition yielded a value of 31.59 microseconds, in other words less than 32 microseconds from start of transition until "power-good". Thus, the output of a simple five-bit counter counting $T_{SW}$ periods could transmit a "power-good" signal to the rest of the exemplary system under development upon completion of this power state transition. Response times within this range empirically prove faster than that of prior art typical closed-loop systems implemented utilizing the pole-zero design methodology.

Figure 9:
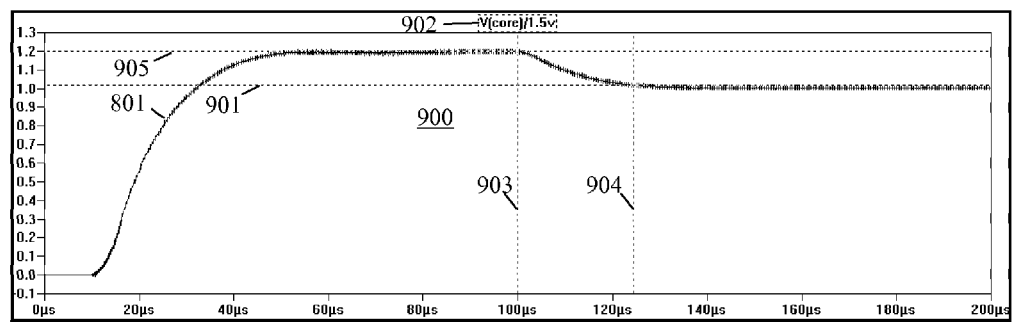
FIG. 9 illustrates an alternate view of the time domain plot of FIG. 8.
Figure 10:
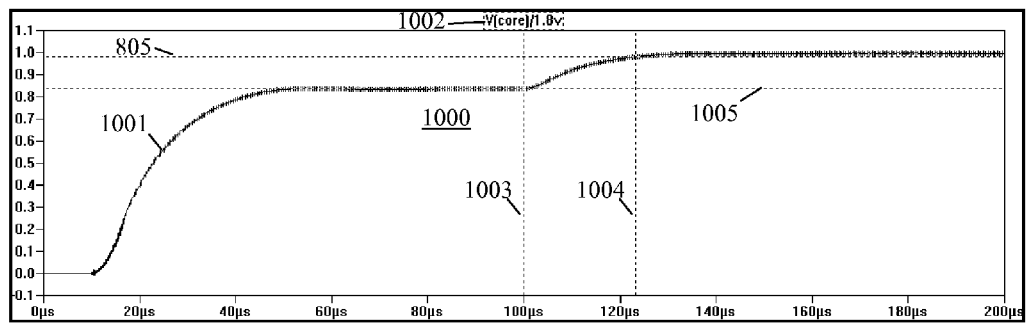
FIG. 10 illustrates a time domain plot of possible transitions in a hypothetical system operating under the control of one embodiment of the present invention.

FIG. 9 represents an alternate view 900 of the time domain response curve 801 whereby the horizontal cursors 901, 905 and vertical cursors 903, 904 now measure the response times of the second exemplary transition from the same simulation that produced response curve 801 in plot 800 of FIG. 8. Now the legend 902 affixes a physical value of 1.5 volts to, while horizontal cursor 901 gauges the approach to within 2% of, the second power state set-point. Horizontal cursor 905 and vertical cursor 903 delineate the point of departure from the previous power state. Vertical cursor 904 minus vertical cursor 903 yields a response time of 24.48 microseconds. In this particular exemplary transition, a pulse sequence describable by equations such as equation 608 with parameters $n_1$ equal to four and $n_2$ equal to two driving the same previously specified plant components further illustrates the relation 612 of FIG. 6 compared to the previous transition measured in FIG. 8 of greater magnitude $|\Delta T_{Set(p)}|$ corresponding to a greater value for $n_1$, with $n_2$ providing fine tuning upon the coarse adjustment of $n_1$. To further prove the validity of relation 612 of FIG. 6, FIG. 10 illustrates the simulation plot 1000 of a response curve 1001 with horizontal cursors 805, 1005 and vertical cursors 1003, 1004 once again measuring the second transition of equal magnitude $|\Delta T_{Set(p)}|$ but opposite direction of the second transition of the previous response curve 801. With exactly the same values for $n_1$ and $n_2$ for the second transition as in the previous simulation plot 900, this simulation plot 1000, with the legend 1002 once again affixing the physical value to 1.8 volts, vertical cursor 1004 minus 1003 yields a value of time to arrive within 2% of the second power state set-point of 23.22 microseconds. This response time for plot 1000 appears close though not exactly equal to the response time of plot 900, due measurement error and error arising from using a fixed ADE instead of a unique ADE for each power state.

Figure 11:
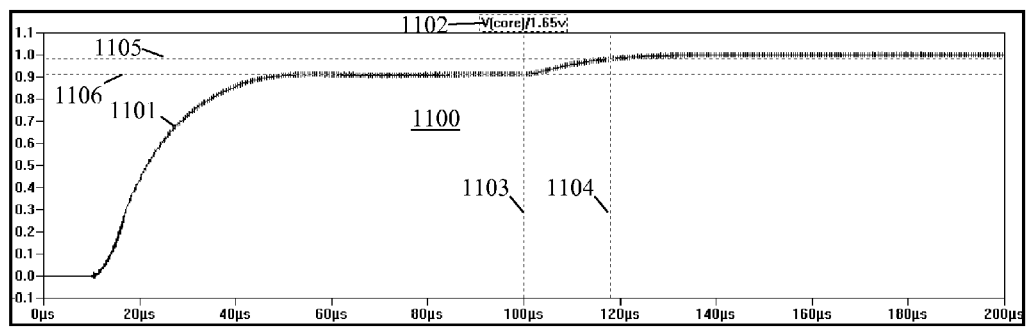
FIG. 11 illustrates a time domain plot of possible transitions in a hypothetical system operating under the control of one embodiment of the present invention.
Figure 12:
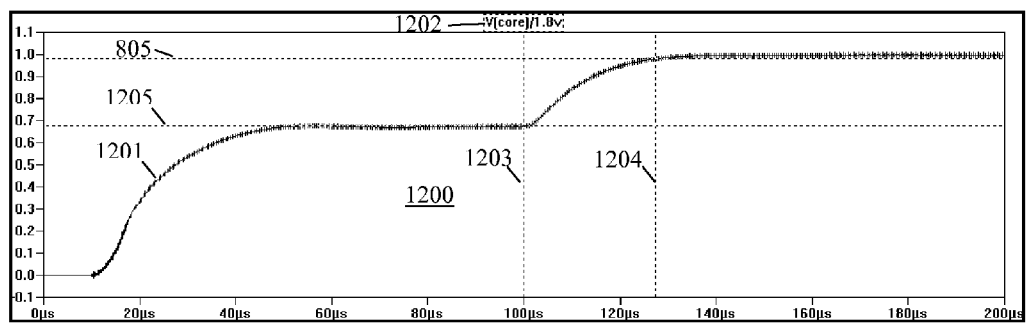
FIG. 12 illustrates a time domain plot of possible transitions in a hypothetical system operating under the control of one embodiment of the present invention.

FIG. 11 exhibits a response curve 1101 in a time domain plot 1100 wherein the vertical cursors 1103, 1104 and horizontal cursors 1105, 1106 delineate the response time and change of amplitude for a second transition of lesser magnitude $|\Delta T_{Set(p)}|$ than that of the previous three figures. In this plot 1100, legend 1102 affixes the physical value of 1.65 volts to the normalized set-point, thus horizontal cursor 1106 delineates the departure from 1.5V to the cursor 1105 delineating the approach to within 2% of the set-point of 1.65 volts. Vertical cursor 1104 minus 1103 measures the response time equal to 17.99 microseconds. FIG. 12 exhibits a response curve 1201 in a time domain plot 1200 wherein the vertical cursors 1203, 1204 and horizontal cursors 1202, 805 delineate the response time and change of amplitude for a second transition of greater magnitude $|\Delta T_{Set(p)}|$ than that of the previous four figures. The values of $n_1$ and $n_2$ for the second transition of this response curve 1201 remain the same as in the previous response curves 801, 901, 1001, 1101 time domain plots 800, 900, 1000, 1100. As before, horizontal cursor 805 marks the approach to within 2% of the set-point of 1.8V according to the legend 1202 whereas the horizontal cursor 1205 delineates the point of departure from 1.2 volts. Here vertical cursor 1204 minus vertical cursor 1203 yields a response time of 27.41 microseconds for a transition time to within 2% of the set-point. Thus, all the aforementioned response curves 801, 901, 1001, 1101, 1201 indicate for the exemplary system under development, $n_1$ equal to seven for transitions of amplitude greater than 1.2 volts and $n_1$ equal to four for transitions less than or equal to 0.6 volts works well. Furthermore, all the aforementioned response curves 801, 901, 1001, 1101, 1201 express the pulse width modulation sequence of the present invention facilitates a near critical damped step response rendering response times predominantly dependent upon the magnitude of change of amplitude for any given transition.

Figure 13:
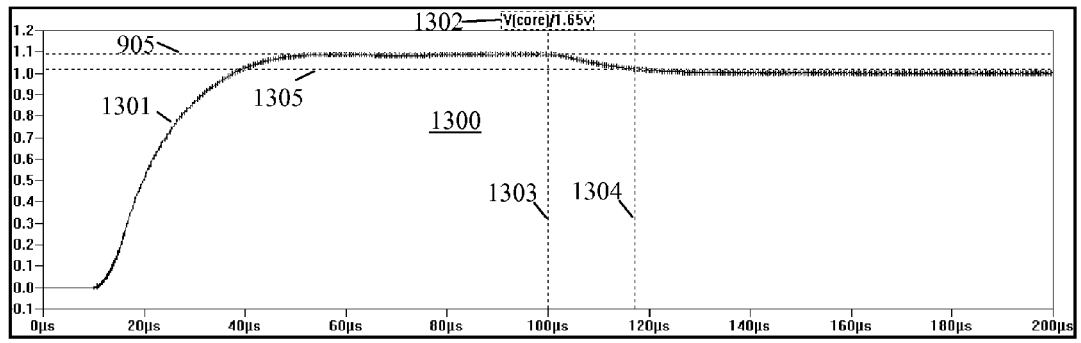
FIG. 13 illustrates a time domain plot of possible transitions in a hypothetical system operating under the control of one embodiment of the present invention.

FIG. 13 resembles FIG. 11 in that the second transition of both response plots 1300 and 1100, respectively exhibit a transition of equal magnitude but opposite direction again. Legend 1302 like legend 1102 affixes the physical value of 1.65 volts to the normalized set-point for the second power state after the second transition. Horizontal cursors 905, 1305 and vertical cursors 1303, 1304 demarcate the amplitude and time of the approach of the response curve 1301 to within 2% of the second power state set-point. Vertical cursor 1304 minus vertical cursor 1303 yields a response time value of 17.15 microseconds, once again differing slightly from the response time of plot 1100. One may account for this difference due to the accuracy of this method of measuring and the error acquired in using a fixed ADE instead of a unique ADE for each power state similar to the response time of plot 1000 differing slightly compared to plot 900. For instance, the inventor found the fixed ADE by following the aforementioned method implied by equation 602 using a Vout of 1.65 volts. Using this fixed ADE for all power states causes an error of+0.33% for a set-point of 1.5 volts, an error of−0.34% for a set-point of 1.8 volts and an error of+1.33% for a set-point of 1.2 volts in the exemplary system under development. Thus, while the magnitude $|\Delta T_{Set(p)}|$ appears equal in the application of equations 608 through 611 to the second transitions of plot 900 and plot 1000, and likewise equal in plot 1100 and plot 1300, the convenient assumption of the viability of an inherent fixed ADE for all the power states can cause a slight aberration in otherwise presumed equal response times.

Figure 14:
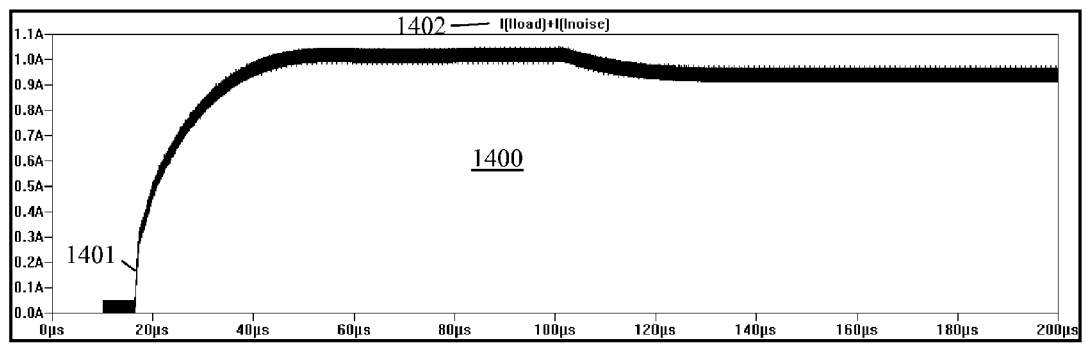
FIG. 14 illustrates the time domain plot of the transitions of FIG. 13 with high frequency noise added.
Figure 15:
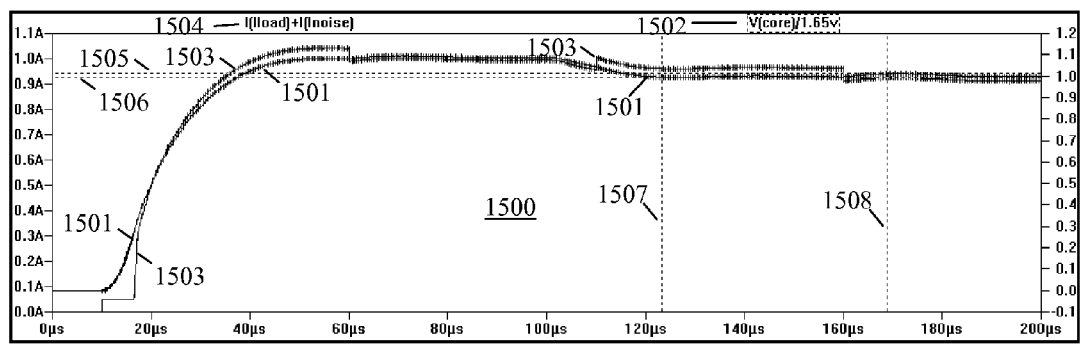
FIG. 15 illustrates the time domain plot of the transitions of FIG. 13 with low frequency noise added.
Figure 16:
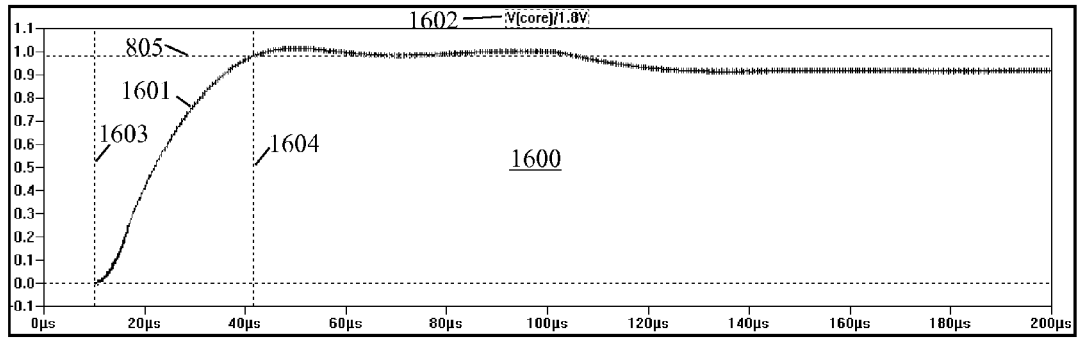
FIG. 16 illustrates the time domain plot of the transitions of FIG. 13 under the condition of the plant components at 110% of their nominal values.
Figure 17:
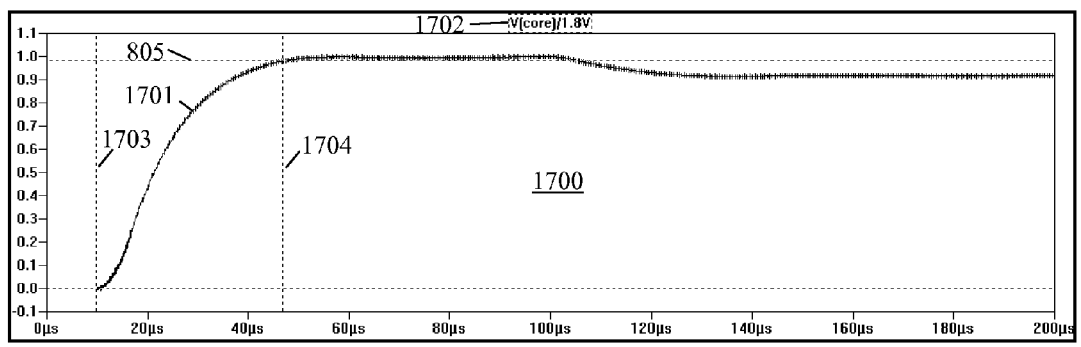
FIG. 17 illustrates the time domain plot of the transitions of FIG. 13, correcting for the condition of the plant components at 110% of their nominal values.

The plots 1400 and 1500 of FIGS. 14 and 15 differ from the other plots of FIGS. 8 through 21 in that the vertical axes on the left hand side of the plots 1400, 1500 now display a scale of amperes instead of a normalized set-point scale. One may readily discern the legend 1402 assigns response curve 1401 the description of load current plus noise current for the plot 1400. While plot 1500 has legend 1504 to do the same for response curve 1503, legend 1502 also affixes the typical physical value for the response curve 1501 to the axis displaying the normalized scale on the right hand side of plot 1500, in this case a physical value of 1.65 volts. Thus, both plots 1400 and 1500 portray the response curves 1401, 1501, 1503 of the exemplary system under development, for the same simulated transitions of plot 1300, only now under the influence of added high frequency and low frequency noise, respectively, as a customary test of stability employed during power supply design. Plot 1400 illustrates the effect of 10 MHz, 50 milliampere, 50% duty cycle noise added, whereas plot 1500 illustrates the effect of 10 KHz, 50 milliampere, 50% duty cycle noise added. In plot 1400, the noise current 1401 is has an envelope that would obliterate the view of a voltage response curve and therefore this specification omits the voltage response curve herein substituting several written statistics. With applying a noise 1401 as shown in plot 1400 the voltage noise never exceeded 50 millivolts peak-to-peak according to measurements taken with horizontal cursors over the plot 1400. Plot 1500 shows the use of horizontal cursors 1505, 1506 in this manner to determine the voltage response curve 1501 deviates from the ideal set-point by less than 1.7% in either positive or negative direction while vertical cursors 1507, 1508 merely demarcate where the peak deviations occur on the time scale.

The remaining response plots 1600, 1700, 1800, 1900, 2000, and 2100 in FIGS. 16 through 21 illustrate the effect of the physical plant and load parameter values differing from those which the designer estimated in the design of the present system under development. The designer easily achieves the effect of deviation of plant and load parameter values in simulation by manually changing lines 501, 502, 519, 520 of code as documented in the simulation code sheet 500 of FIG. 5. In lieu of a thorough Monte Carlo analysis, which an automated script process could accomplish, this specification will highlight a particularly effectual subset of operational corners one may encounter in the design of the exemplary system under development visible in the remaining response plots. Because transitions of greatest magnitude enhance the visibility of the effects of parameter variance that result in a departure from near critical damped step response, the legends 1602, 1702, 1802, 1902, 2002, 2102 affix the physical value of greatest magnitude thus far, 1.8 volts to the normalized set-point of the remaining response curves 1601, 1701, 1801, 1901, 2001, 2101, respectively. Response curve 1601 in plot 1600 of FIG. 16 once again presents the first transition to a normalized set-point to which legend 1602 affixes the physical value of 1.8 volts. As before, the horizontal cursor 805 delineates the approach to within 2% of the set-point whereby one can readily see a pronounced overshoot phenomenon has occurred. Both the inductance value in line 501 and the capacitance value in line 502 of the simulation code sheet 500 have simultaneously increased 10% beyond their nominal values to which the designer has applied the pulse width modulation sequence of the present invention. Even in such adverse conditions, the aberration of overshoot extends less than 1.6% beyond the set-point according to measurements facilitated by the use of the horizontal cursor 805. Vertical cursor 1604 minus vertical cursor 1603 demarcates the period of rise from 0% to 98% amplitude equal to 31.65 microseconds. As both the inductance and capacitance values have exceeded their nominal values for the given pulse width modulation sequence, one may consider this response curve 1601 as depicting an under-driven operational state, although the resultant overshoot phenomenon renders this under-driven principle counterintuitive. While overshoot of only 1.6% may not violate the specified regulation for the exemplary system under development, the present invention specification will now disclose a technique to recover near critical damped step response given such adverse conditions as plant inductance and capacitance values exceeding their nominal values by 10%. Through a process of iterative coarse adjustments to the $n_1$ variable and fine tuning of $n_2$ one may arrive at the compensation for the inductance and capacitance of the plant components in excess of 10% of their nominal values as shown in response curve 1701 of plot 1700 in FIG. 17. Here the horizontal cursor 805 verifies by delineating less than 1.7% undershoot and virtually no overshoot, the response 1701 retained a near critical damped criterion. Cursor 1704 minus 1703 exhibits the 0%-to-98% amplitude rise time which substantiates the notion of an under-driven control plant with the time now equal to 37.03 microseconds, slower than the previous response 1601. Nevertheless, the 0%-to-95% amplitude rise time remains below 32 microseconds for the compensated response 1701, allowing implementation of the same simple aforementioned "power-good" circuit and output signal despite the need for compensation for excessive plant component values. Setting the value of $n_1$ to eight and $n_2$ to negative one allowed this recovery of near critical damped step response, when the previous under-driven response 1601 existed when $n_1$ equaled seven and $n_2$ equaled zero with both responses 1601, 1701 in the presence of 10% excessive plant component inductance and capacitance values. This exemplifies the use of relation 612 of FIG. 6 and the principle of coarse and fine tuning the values of $n_1$ and $n_2$, respectively, to achieve or retain near critical damped step response, quite concisely.

Figure 18:
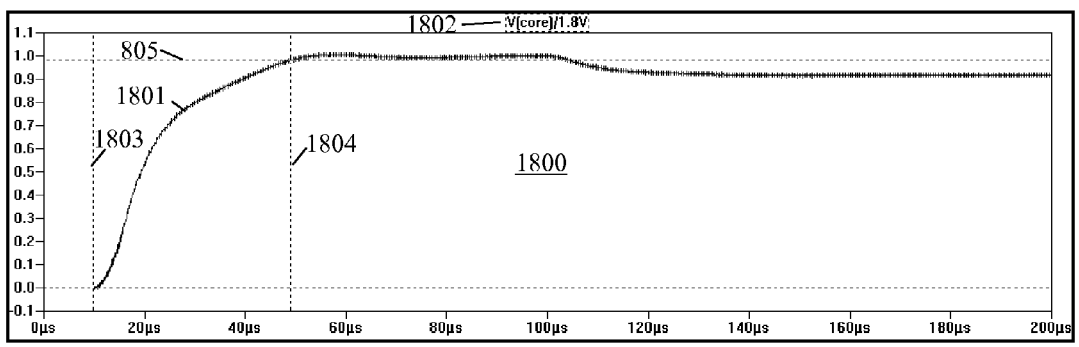
FIG. 18 illustrates the time domain plot of the transitions of FIG. 13 under the condition of the plant components at 90% of their nominal values.
Figure 19:
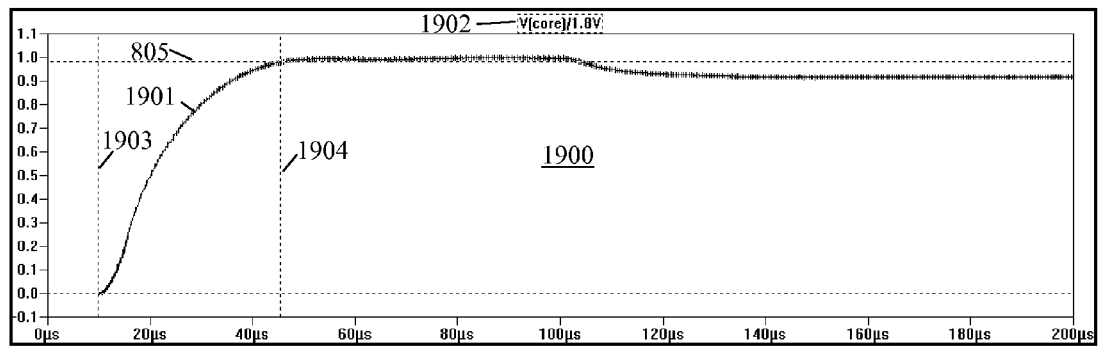
FIG. 19 illustrates the time domain plot of the transitions of FIG. 13, correcting for the condition of the plant components at 90% of their nominal values.

The simulation that generated plot 1800 of FIG. 18 presents the condition whereby one can noticeably see an anomalous response curve 1801 has occurred. In this simulation, both the inductance value in line 501 and the capacitance value in line 502 of the simulation code sheet 500 have simultaneously decreased 10% below their nominal values to which the designer has applied the pulse width modulation sequence of the present invention. Given these lower component values qualifies this as an overdriven condition, but once again, the aberration of overshoot extends less than 1.6% beyond the set-point according to measurements facilitated by the use of the horizontal cursor 805. Most significantly, vertical cursor 1804 minus vertical cursor 1803 demarcates the period of rise from 0% to 98% amplitude equal to 39.12 microseconds, and thus even the 0%-to-95% amplitude rise time, at 34.52 microseconds exceeds the benchmark rise time of is less than 32 microseconds which permits implementation of the aforementioned "power-good" circuit and output signal. As before for the under-driven case, the invention enables compensation for the overdriven case, by making a coarse adjustment to $n_1$ and fine tuning $n_2$, only this time, in the opposite direction compared to the previous case of an under-driven plant. In doing so, setting $n_1$ equal to six and $n_2$ equal to one, the design achieves the response 1901 of simulation plot 1900 in FIG. 19. With this compensation, vertical cursor 1904 minus vertical cursor 1903 now yields a 0%-to-98% rise time of 35.57 microseconds and a 0%-to-95% rise time of 30.75 microseconds, once again, allowing implementation of the same simple aforementioned "power-good" circuit and output signal despite the need for compensation for less than nominal plant component values. Since the advent of the reference U.S. Pat. No. 6,940,189, molybdenum permalloy powder "distributed gap" cores for inductors have proliferated the marketplace availing designers to inductors that retain 5% tolerance in inductance over the range of current described therein. In addition, X7R ceramic materials that retain a capacitance tolerance within 10% over the bias voltage described therein have reached a cost effective price. Both of these inductive and capacitive components of advanced materials retain these tolerances while operating over the 0-to-70 degree Celsius temperature range. Thus, the present invention and its ability to compensate for plant component value deviations along with components of advanced materials, satisfy a wide range of applications.

Figure 20:
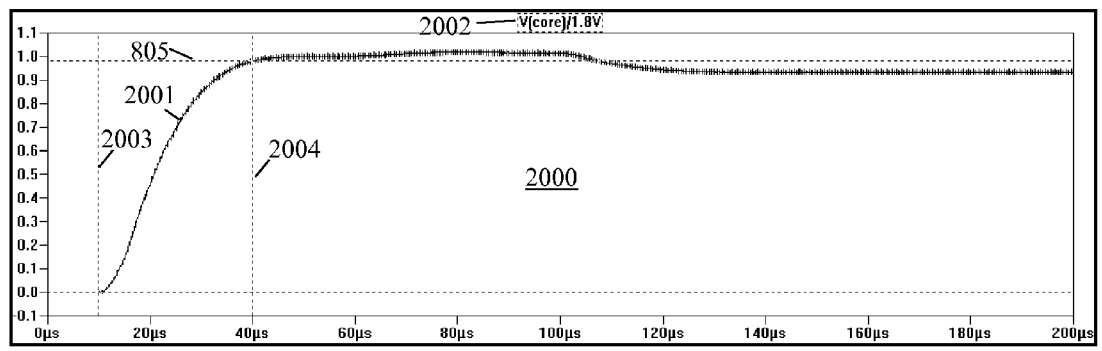
FIG. 20 illustrates the time domain plot of the transitions of FIG. 13 under the condition of the equivalent load resistance at 125% of its nominal value.
Figure 21:
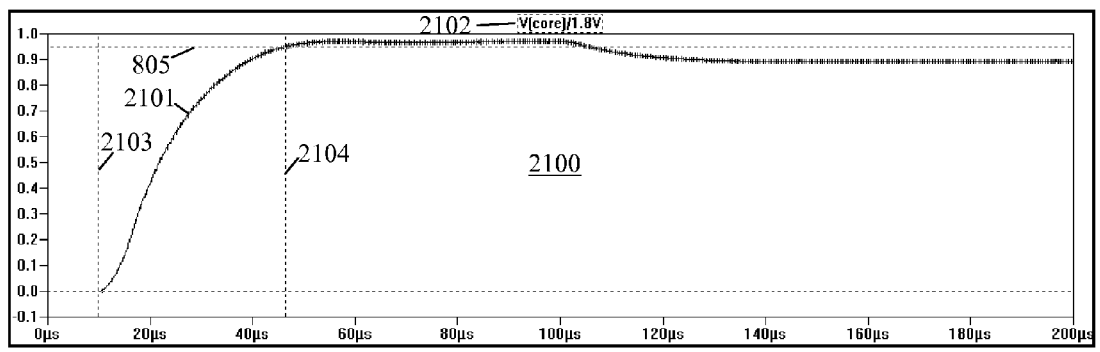
FIG. 21 illustrates the time domain plot of the transitions of FIG. 13 under the condition of the equivalent load resistance at 75% of its nominal value.

The specification will now turn to FIG. 20 and FIG. 21 to discuss the case of the load deviating from the original estimates, assuming an equivalent resistance 25% greater and 25% lesser, in the response plots 2000, and 2100, respectively. In order to simulate such conditions, the designer comments out line 519, and uncomments line 520 with the appropriate resistor value inserted in the simulation code sheet 500, for the exemplary system under development. Response plot 2000 displays the response curve 2001 due to overdriven plant components. Given the novel approach offered by the present invention, one may address this overdriven state using the same compensation technique that corrected the simulation plot 1800, namely reducing $n_1$ and fine tuning $n_2$ accordingly. In the case of a computation-intensive implementation of the control plant, reducing the value of ADE for the destination power state as shown in plot 2000 can also adequately compensate for such an overdriven condition. Nonetheless, should the designer leave the present condition uncompensated, vertical cursor 2004 minus vertical cursor 2003 delineates a 0%-to-98% rise time of 30.13 microseconds while one may position horizontal cursor 805 to verify an overshoot of less than 1.8% in plot 2000. Both of these qualifying metrics appear within specified limits despite a load current of 80% nominal for the exemplary system under development. Likewise, response plot 2100 illustrates the response curve 2101 resulting from under-driven plant components due to a load at 133% of rated current. Once again, in the case of a computation-intensive implementation of the control plant, increasing the value of ADE for the power state as shown in plot 2000 can also adequately compensate for such an under-driven condition. While adjusting $n_1$ and $n_2$ may somewhat improve the appearance of the response curve 2101, this alone cannot recover the loss through the physical switching element due to excessive load current, and therefore adjusting ADE makes the desired remedy possible. Without this remedy, vertical cursor 2104 minus 2103 indicates a rise time over 36 microseconds to what horizontal cursor 805 can prove as only 97% set-point amplitude.

Figure 22:
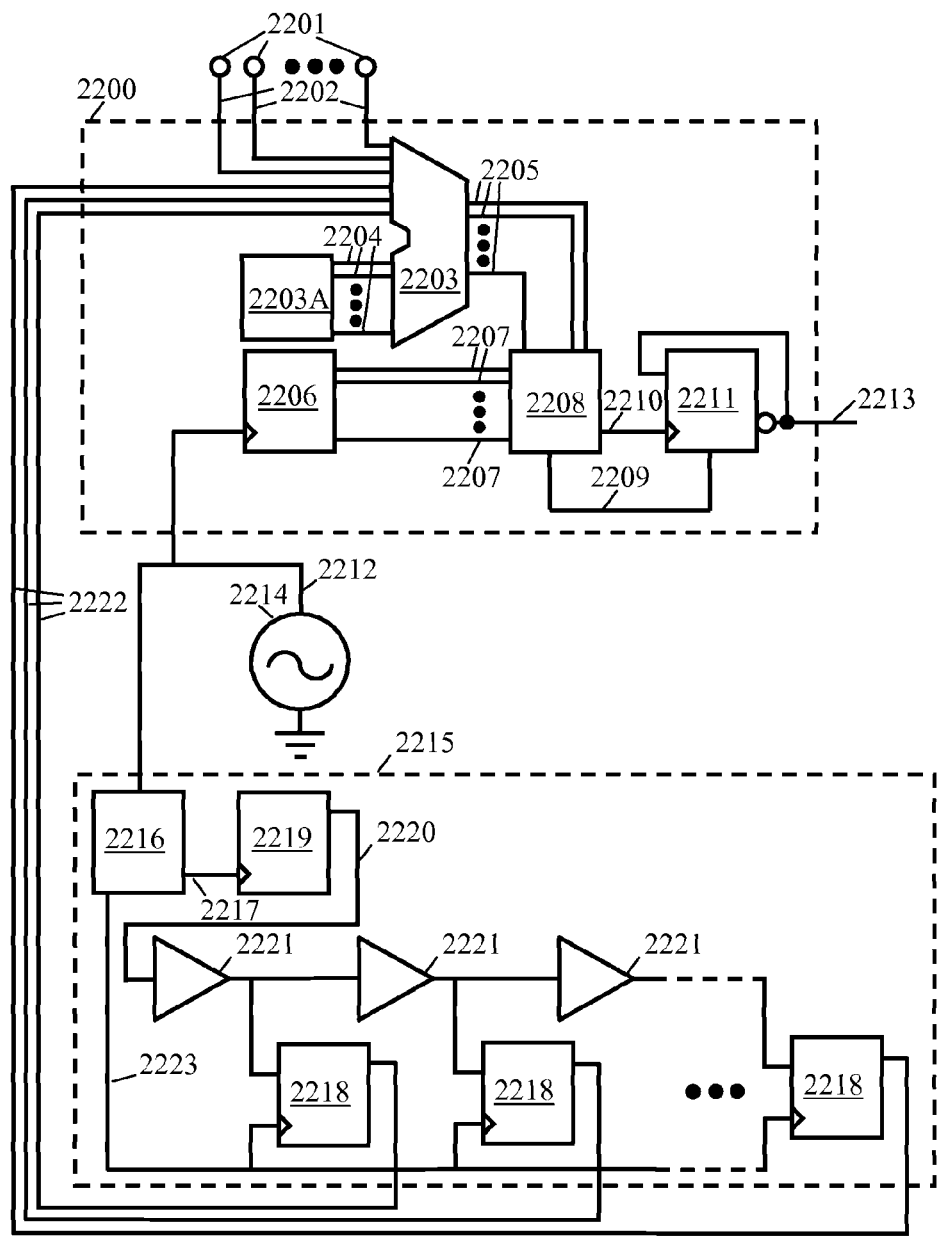
FIG. 22 illustrates a schematic view of an alternate embodiment within the scope of the present invention.

Finally this specification will further exemplify the application of the present invention in a closed loop system whereby the digital core introduced in the exemplary reference U.S. Pat. No. 6,940,189 affects pulse width, given core cell delay data directly proportional to the core voltage applied. FIG. 22 illustrates a block diagram of a closed loop control plant comprising the pulse width modulation controller 2200, along with the feedback block 2215, but excludes the inductive, capacitive, and switching elements needed for implementation within an exemplary embodiment of the present invention. Some functional blocks within FIG. 22 duplicate those described in the reference patent, but the specification of the present invention adds circuitry around, and supplemental features within these functional blocks to extend the complete system beyond the scope of the reference patent. The clock output 2212 of oscillator circuit 2214 feeds a counter 2206 that derives the power supply switching frequency, $F_{SW}$ and duty cycle through decoder 2208, with D flip-flop 2211 responding to signals 2209 and 2210 to form the output 2213 that feeds the gate driver Vgdrvr that drives the switching transistors 406, 407. By characterizing the inductive, capacitive, and switching plant components, the load current in all power states and transitions, and knowing its fixed input and output supply voltages, the pulse width modulation controller 2200 may hold values for power supply duty cycle relative to various supply current states. The pulse width modulation controller 2200 may hold power supply duty cycle values in decode logic configurations, or stored in registers or memory locations as depicted by block 2203A, and thus fix the power supply output precisely for every power state. Block 2203 or 2203A may also comprise a portion of or the entire aforementioned state machine controlling the system during transitions. The decoder 2208 compares the frequency dividing clock count on bus 2207 to a value on bus 2205 that represents a duty cycle value corresponding to the present power state, or scaled pulse width during transitions, that obtains the correct output voltage or step response by resetting D flip-flop 2211 by asserting pulse signal 2209 at the correct time. Between the output bus 2204 of block 2203A and bus 2205 into decoder 2208 exists an arithmetic logic unit 2203 that has a 20 specific purpose according to the reference U.S. patent 6,940,189 relating to the function of bus 2202 bringing an offset value input from binary pads 2201. The present invention offers some alternate embodiments wherein the hypothetical use of this offset corrects for the values stored in block 2203A underestimating or overestimating the actual values of plant components or load currents. Once verified empirically, the present invention may use these offset values to compensate any step response or power state by adjusting $n_1$, $n_2$, $A_{DE}$, or $|\Delta T_{Set(p)}|$ in accordance with any of the aforementioned compensating techniques for any of the exemplary computation-intensive or memory-intensive embodiments of the control plant. Let it be known that minor deviations or omissions, partial or complete non-implementation of this offset adjusting mechanism does not constitute a substantial departure beyond the scope of the present invention.

While so far this specification of the present invention has discussed an open loop operative topology, bus 2222 from core feedback block 2215 providing an additional lo coefficient to the arithmetic logic unit 2203 can close the loop for an exemplary system. Considering a structural view, all components discussed thus far must draw power from the input voltage source, but core feedback block 2215 inherently must draw power from the output voltage source, in other words, the core voltage in the exemplary system under development, in order to accurately provide feedback. First, a phase lock loop within the timing control block 2216 takes the clock output 2212 from an oscillator 2214 to produce a higher frequency digital clock 2217 that synchronizes the delay pulse controller 2219 and delay measurement flip-flops 2218 to the pulse width modulation controller 2200. The digital clock 2217 also feeds the rest of the synchronous application logic not shown, in the digital core and may vary in speed dependent upon the application and thus affect the power state of the entire exemplary system under development. The delay pulse controller 2219 controls the output 2220 providing a pulse that propagates through a delay chain symbolized by buffers 2221, as the timing control block 2216 determines using signal 2223 the exact moment the delay measurement flip-flops 2218 sample the delay chain buffers 2221. Thus, the arithmetic logic unit 2203 receives from bus 2222 a vector indicating the number of delay chain buffers 2221 through which the pulse from the controller output 2220 propagated, measured by flip-flops 2218. While this vector on bus 2222 may exist in any arbitrary format, the arithmetic logic unit 2203 decodes and compares this vector to an expected value of delay that guarantees margin in the safe operating range for the rest of the synchronous application logic within the digital core. The system designer may find this expected value of delay by determining the longest delay path in the synchronous application logic within the digital core as given by the design automation tools, and then replicating a delay chain of buffers 2221 of approximately twice the length of this maximum core application logic delay path plus safety margin. The present invention herein defines a coefficient for this propagation time, ATP, equal to the ratio of the vector originating from buffers 2221 divided by the quantity of core application logic maximum delay path expected value plus margin. Therefore, for a closed loop feedback path such as that depicted in core block 2215, one may implement complete closed loop control topology for the exemplary system under development by factoring the coefficient ATP into equation 610 to result in: $T_{Set(p)} \equiv A_{V(p)} A_{DE(p)} A_{TP} T_{SW}$ when applying equations 608 or 609 to the design of the control plant.

In closing, one may note that while this specification depicted the application of the present invention in rote fashion, any embodiment which automates these rote processes does not constitute a departure from the scope and spirit of the present invention. For instance, any computer program, computer script, spreadsheet, simulation tool, or other design automation tool that automates: the aforementioned time domain tuning; the generation or adjustments to variables or coefficients $n_1$, $n_2$, $A_V$, $A_{DE}$, $A_{TP}$, $T_{SW}$; the generation or alteration of a hardware description language that specifies or models the control plant such as, but not limited to, VHDL, Verilog HDL, or System C, et cetera; the generation of pulse width dithering; or analysis such as margining the plant component capacitance, inductance, switching loss, load current values, or Monte Carlo analysis, clearly does not present a substantial departure from the scope and spirit of the present invention.

From the preceding description of the present invention, this specification manifests various techniques for use in implementing the concepts of the present invention without departing from its scope. Furthermore, while this specification describes the present invention with specific reference to certain embodiments, a person of ordinary skill in the art would recognize that one could make changes in form and detail without departing from the scope and the spirit of the invention. This specification presented embodiments in all respects as illustrative and not restrictive. All parties must understand that this specification does not limited the present invention to the previously described particular embodiments, but asserts the present invention's capability of many rearrangements, modifications, omissions, and substitutions without departing from its scope.

Thus, a pulse width modulation sequence generating a near critical damped step response has been described.

What is claimed is:

1. A control system for providing a substantially critical damped step response to a circuit via a pulse width modulation control scheme, the control system comprising:
a controller configured to control switching elements of a pulse width modulated power supply to output a predetermined pulse sequence to the circuit, wherein the predetermined pulse sequence includes pulses having predetermined scaled pulse widths respectively determined to collectively provide a substantially critical damped step response for a predetermined state transition in the circuit based on a predefined model of the circuit, and wherein the predefined model includes at least analogous elements of inductance, capacitance, load, and power switching characteristics.

2. The control system of claim 1, wherein the predetermined scaled pulse widths are determined in accordance with a state transition drive function comprising a time domain critical damped step response function term.

3. The control system of claim 2, wherein a coefficient of the time domain critical damped step response function term is determined based on elements of the predefined model.

4. The control system of claim 2, wherein the controller is further configured to adjust a coefficient of the state transition drive function based on an environmental condition.

5. The control system of claim 2, wherein the predefined model further comprises non-ideal circuit elements, and wherein the state transition drive function further comprises a coefficient that compensates for dynamic error caused by loss of power from non-ideal physical behavior in the circuit elements.

6. The control system of claim 1, wherein the controller is further configured to control the switching elements of the pulse width modulated power supply to output the predetermined pulse sequence with pulses having dithered scaled pulse widths, whereby a series of the pulses of the predetermined pulse sequence having an ideal determined scaled pulse width is approximated by alternating between a pulse having a scaled pulse width greater than the ideal determined scaled pulse width and a pulse having a scaled pulse width less than the ideal determined scaled pulse width.

7. The control system of claim 2, wherein the controller comprises circuitry configured to determine a compensated coefficient of the state transition drive function based on data representing elements of the predefined model and data representing the corresponding elements of the circuit.

8. The control system of claim 2, wherein the state transition drive function further comprises an initializing term having a coefficient configured to cause the controller to control the switching elements of the pulse width modulated power supply to scale a pulse width of each pulse of a predetermined initializing pulse sequence in accordance with a same fixed value based on a final steady state set point of pulse widths for the predetermined state transition.

9. The control system of claim 2, wherein the controller is further configured to control the switching elements of the pulse width modulated power supply to output a predetermined pulse sequence including pulses having scaled pulse widths determined in accordance with a continuous time function comprising:

$$(1-(1+\omega_0 t)e^{-\omega_0 t})$$

where $\omega_0$ is a resonant frequency in radians per second of the model circuit, t is time in seconds after initiation of the predetermined state transition, and e is a constant equal to the mathematical base of natural logarithms.

10. The control system of claim 2, wherein the controller is further configured to control the switching elements of the pulse width modulated power supply to output a predetermined pulse sequence including pulses having scaled pulse widths determined in accordance with a discrete time function comprising:

$$(1(1+\omega_0(n+n_2)T_{sw})e^{-\omega_0(n+n_2)T_{sw}})$$

where $\omega_0$ is a resonant frequency in radians per second of the model circuit, n is a discrete index of time that counts pulses starting at the initiation of the predetermined state transition, $n_2$ is a discrete variable for fine tuning a response of the analogous elements of the predefined model circuit, $T_{sw}$ is a time of a switching period in seconds in accordance with the power switching characteristics, and e is a constant equal to the mathematical base of natural logarithms.

11. The control system of claim 2, wherein the controller is configured to control the switching elements of the pulse width modulated power supply to output a predetermined pulse sequence including pulses having scaled pulse widths determined in accordance with a discrete time function:

$$x_m(t) = V_{sw} \sum_{n=0}^{N} (u(t-t_0) - u(t-t_0-n_1 T_{sw}))[u(t-t_0-nT_{sw}) -$$

$$u(t-t_0-nT_{sw}-T_{Set(p+1)})] +$$

-continued
$$u(t-t_0-n_1 T_{sw})[u(t-t_0-nT_{sw}) - u(t-t_0-nT_{sw} -$$

$$(T_{Set(p)} + (\Delta T_{Set(p)})(1 - (1+\omega_0(n+n_2)T_{sw})e^{-\omega_0(n+n_2)T_{sw}})))];$$

where $x_m(t)$ is a time domain function defining the pulses output to the circuit during the predetermined pulse sequence for the predetermined state transition identified uniquely by an index m, $V_{sw}$ is an amplitude of a pulse of the predetermined pulse sequence input to the circuit, n is a discrete index of time that counts pulses starting at initiation of the predetermined state transition, N is a practical upper limit of a number of pulses coincidental to a pulse width of the predetermined pulse sequence having reached a final steady state set point for the predetermined state transition to within a desired accuracy of the control system, u(t) is a mathematical artifice representing a unit step function, t is time in seconds, $t_0$ specifies an arbitrary instant in time corresponding to the initiation of the predetermined state transition, $n_1$ is a discrete variable denoting a number of the pulses starting at the initiation of the predetermined state transition within which pulses of the predetermined pulse sequence are set at the final steady state set point for the predetermined state transition so as to provide a precise amount of power to initiate a substantially critical damped step response manifest in the circuit, $T_{sw}$ is a time of a switching period in seconds in accordance with the power switching characteristics, $T_{Set(p)}$ is a pulse width during a steady state set point for a predefined system power state identified uniquely by index p, $\Delta T_{Set(m)}$ is a change in pulse width during the predetermined state transition identified uniquely by the index m from the predetermined system power state uniquely identified by the index p to a predetermined system power state identified uniquely by index p+1 such that $\Delta T_{Set(m)} = T_{Set(p+1)} - T_{Set(p)}$, $\omega_0$ is a resonant frequency in radians per second of the model circuit, $n_2$ is a discrete variable for fine tuning a response of the analogous elements of the predefined model circuit, and e is a constant equal to the mathematical base of natural logarithms.

12. The control system of claim 11, further comprising memory or logic configured to store the coefficient $\Delta T_{Set(m)}$ as an absolute value, wherein the controller is further configured to control the switching elements of the pulse width modulated power supply to output the predetermined pulse sequence with pulses having scaled pulse widths respectively determined in accordance with the discrete time function to reversibly provide the substantially critical damped step response in the circuit for the predetermined state transition of the circuit by adding or subtracting the absolute value of the coefficient $\Delta T_{Set(m)}$.

13. A method for providing a substantially critical damped step response to a circuit via a pulse width modulation control scheme, the method comprising:
defining a model of the circuit, wherein the model includes at least analogous elements of inductance, capacitance, load, and power switching characteristics; and
controlling switching elements of a pulse width modulated power supply to output a predetermined pulse sequence to the circuit, wherein the predetermined pulse sequence includes pulses having predetermined scaled pulse widths respectively determined to collectively provide a substantially critical damped step response in the circuit for a predetermined state transition of the circuit based on the predefined model of the circuit.

14. The method of claim 13, wherein said controlling switching elements comprises respectively determining the scaled pulse widths of the pulses of the predetermined pulse sequence in accordance with a state transition drive function including a time domain critical damped step response function term.

15. The method of claim 14, further comprising determining a coefficient of the time domain critical damped step response function term based on elements of the predefined model.

16. The method of claim 15, wherein said determining a coefficient comprises adjusting the coefficient based on an environmental condition.

17. The method of claim 14, wherein said defining a model of the circuit comprises non-ideal circuit elements, and wherein the state transition drive function comprises a coefficient that compensates for dynamic error caused by loss of power from non-ideal physical behavior in the circuit elements.

18. The method of claim 13, wherein said controlling switching elements comprises controlling the switching elements of the pulse width modulated power supply to output a predetermined pulse sequence including pulses having dithered scaled pulse widths, whereby a series of the pulses of the predetermined pulse sequence having an ideal determined scaled pulse width is approximated by alternating between a pulse having a scaled pulse width greater than the ideal determined scaled pulse width and a pulse having a scaled pulse width less than the ideal determined scaled pulse width.

19. The method of claim 14, wherein said controlling switching elements comprises determining a compensated coefficient of the state transition drive function based on data representing elements of the predefined model and data representing corresponding elements of the circuit.

20. The method of claim 14, wherein said controlling switching elements comprises controlling the switching elements in accordance with a state transition drive function further including an initializing term having a coefficient for controlling the switching elements of the pulse width modulated power supply to scale a pulse width of each pulse of a predetermined initializing pulse sequence in accordance with a same fixed value based on a final steady state set point of pulse widths for the predetermined state transition.

21. The method of claim 14, wherein said controlling switching elements comprises controlling the switching elements of the pulse width modulated power supply to output a predetermined pulse sequence including pulses having scaled pulse widths determined in accordance with a continuous time function comprising:

$$(1-(1+\omega_0 t)e^{-\omega_0 t})$$

where $\omega_0$ is a resonant frequency in radians per second of the model circuit, t is time in seconds after initiation of the predetermined state transition, and e is a constant equal to the mathematical base of natural logarithms.

22. The method of claim 14, further comprising storing a coefficient of the state transition drive function as an absolute value in memory or logic, wherein said controlling switching elements comprises controlling the switching elements of the pulse width modulated power supply to output a predetermined pulse sequence including pulses having scaled pulse widths respectively determined in accordance with the state transition drive function to reversibly provide a substantially critical damped step response in the circuit for the predetermined state transition of the circuit by adding or subtracting the absolute value of the stored coefficient.

23. A computer-readable medium having stored thereon computer-executable instructions that, if executed by a computing device, cause the computing device to perform a method for providing a substantially critical damped step response to a circuit in a pulse width modulation control scheme, the method comprising:
  defining a model of the circuit, wherein the model includes at least analogous elements of inductance, capacitance, load, and power switching characteristics; and
  controlling switching elements of a pulse width modulated power supply to output a predetermined pulse sequence to the circuit, wherein the predetermined pulse sequence includes pulses having predetermined scaled pulse widths respectively determined to collectively provide a substantially critical damped step response in the circuit for a predetermined state transition of the circuit based on the predefined model of the circuit.

24. A control system for providing a substantially critical damped step response in a circuit via a pulse width modulation control scheme, the control system comprising:
  means for driving switching elements of a pulse width modulated power supply for the circuit; and
  means for controlling the driving of the switching elements to output a predetermined pulse sequence to the circuit, wherein the predetermined pulse sequence includes pulses having predetermined scaled pulse widths respectively determined to collectively provide a substantially critical damped step response for a predetermined state transition in the circuit based on a predefined model of the circuit, wherein the predefined model includes at least analogous elements of inductance, capacitance, load, and power switching characteristics.

* * * * *

UNITED STATES PATENT AND TRADEMARK OFFICE
CERTIFICATE OF CORRECTION

PATENT NO. : 7,889,019 B2  
APPLICATION NO. : 11/549586  
DATED : February 15, 2011  
INVENTOR(S) : Gizara Page 1 of 1

It is certified that error appears in the above-identified patent and that said Letters Patent is hereby corrected as shown below:

Title Page;
Page 2, item (56), under "Other Publications", in Column 2, Line 8, delete "Sumposium" and insert -- Symposium --.

Page 2, item (56), under "Other Publications", in Column 2, Line 12, delete "Conferenc e" and insert -- Conference --.

Column 21, line 45, in Claim 10, delete "(1(1" and insert -- (1-(1 --.

Column 22, line 5, in Claim 11, delete "($\Delta T_{Set(p)}$)" and insert -- ($\Delta T_{Set(m)}$) --.

Column 22, line 5, in Claim 11, delete ")))];" and insert -- )))] --.

Column 22, lines 38-39, in Claim 11, delete "$\Delta T_{Set(m)=TSet(p+1)}$-$T_{Set(p)}$," and insert -- $\Delta T_{Set(m)}=T_{Set(p+1)}-T_{Set(p)}$, --.

Signed and Sealed this

Thirteenth Day of September, 2011

David J. Kappos  
*Director of the United States Patent and Trademark Office*